United States Patent
Pupalaikis et al.

(10) Patent No.: US 9,231,608 B1
(45) Date of Patent: Jan. 5, 2016

(54) METHOD AND APPARATUS FOR CORRECTION OF TIME INTERLEAVED ADCS

(71) Applicant: Teledyne LeCroy, Inc., Thousand Oaks, CA (US)

(72) Inventors: Peter J Pupalaikis, Ramsey, NJ (US); Kaviyesh Doshi, Emerson, NJ (US)

(73) Assignee: Teledyne LeCroy, Inc., Thousand Oaks, CA (US)

( * ) Notice: Subject to any disclaimer, the term of this patent is extended or adjusted under 35 U.S.C. 154(b) by 0 days.

(21) Appl. No.: 14/801,238

(22) Filed: Jul. 16, 2015

Related U.S. Application Data

(60) Provisional application No. 62/135,319, filed on Mar. 19, 2015.

(51) Int. Cl.
 *H03M 1/10* (2006.01)
 *H03M 1/12* (2006.01)

(52) U.S. Cl.
 CPC ............ *H03M 1/1028* (2013.01); *H03M 1/121* (2013.01); *H03M 1/1245* (2013.01)

(58) Field of Classification Search
 CPC . H03M 1/121; H03M 1/1245; H03M 1/1028; H04L 27/2624
 USPC .......... 341/118–155; 375/296, 295, 340, 298, 375/259, 300, 320, 222; 370/480, 441, 208, 370/210, 442
 See application file for complete search history.

(56) References Cited

U.S. PATENT DOCUMENTS

| | | | |
|---|---|---|---|
| 5,568,142 A * | 10/1996 | Velazquez | H03M 1/121 341/126 |
| 6,567,030 B1 | 5/2003 | Pupalaikis | |
| 6,819,279 B2 | 11/2004 | Pupalaikis | |
| 7,219,037 B2 * | 5/2007 | Pupalaikis | G01R 13/0272 341/126 |
| 7,386,409 B2 | 6/2008 | Mueller et al. | |
| 7,482,956 B2 * | 1/2009 | Huang | H03M 1/1028 341/120 |
| 7,741,982 B2 | 6/2010 | Johansson et al. | |
| 7,978,104 B2 | 7/2011 | Johansson | |
| 8,307,248 B2 | 11/2012 | Johansson et al. | |
| 8,441,379 B2 | 5/2013 | Eklund et al. | |
| 9,088,293 B1 * | 7/2015 | D'Souza | H03M 1/121 |
| 9,143,147 B1 * | 9/2015 | Ray | H03M 1/1023 |
| 2010/0253557 A1 * | 10/2010 | Kidambi | H03M 1/0624 341/118 |
| 2011/0234435 A1 * | 9/2011 | Woodward | H03M 1/124 341/137 |

(Continued)

*Primary Examiner* — Lam T Mai
(74) *Attorney, Agent, or Firm* — Gordon Kessler

(57) ABSTRACT

A method and apparatus is provided for on-the-fly calibration of and correction for time interleave error, including generation of correction data associated with an interleave corrector employed by a system for converting a time-domain input stream, corresponding to samples acquired from an interleaved system of digitizers having impairment due to interleave mismatch, to a time-domain output stream. The method includes determining at least one time-domain acquisition segment; determining at least one frequency-domain acquisition segment; determining at least one frequency-domain block acquisition segment, whereby the frequency-domain block acquisition segment comprises a block of tone values; determining the suitability of the frequency-domain block acquisition segment for use in the generation of adjusted correction data; determining a block dominant tone segment from the frequency-domain block acquisition segment; and determining a block impairment transfer column vector in accordance with the block dominant tone segment and the frequency-domain block acquisition segment.

17 Claims, 6 Drawing Sheets

(56) References Cited

U.S. PATENT DOCUMENTS

| | | | |
|---|---|---|---|
| 2012/0281784 A1* | 11/2012 | Beydoun | H03M 1/1028 375/295 |
| 2012/0309337 A1* | 12/2012 | Zhu | H04L 7/0334 455/341 |
| 2014/0105339 A1* | 4/2014 | Zhu | H04L 7/0334 375/354 |

* cited by examiner

```
 1  from LiCalc import LiCalc
 2  from InterleaveInfo import InterleaveInfo
 3  from Matrix import Matrix
 4
 5  class OnTheFlyInterleaveCorrection():
 6      def __init__(self,K,I):
 7          self.m_ilv=InterleaveInfo(K,I)
 8          self.m_Hb=[Matrix.identity(I) for b in range(self.m_ilv.m_NB)]
 9          self.m_Xprime=[Matrix(None) for n in range(self.m_ilv.m_N+1)]
10          self.m_Xhat=[Matrix(None) for n in range(self.m_ilv.m_N+1)]
11          self.m_Li=LiCalc(I)
12          self.m_H=Matrix.initialized(1,self.m_ilv.m_N+1,I)
13      def WhichMeasurementTones(self,x,LowThFrac,HighThAbs):
14          WhichOnes = []
15          for n in range(self.m_ilv.m_N+1):
16              rtf=self.m_ilv.m_R[n]
17              t=self.m_ilv.m_T[n]
18              isOne = True
19              for i in range(self.m_ilv.m_I):
20                  if t[i]!=0:
21                      if abs(x[rtf[i]][0]) < HighThAbs:
22                          isOne = False
23                          break
24                      else: mul = abs(x[rtf[i]][0])
25              if isOne:
26                  LowThAbs = LowThFrac*mul
27                  for i in range(self.m_ilv.m_I):
28                      if t[i]==0:
29                          if abs(x[rtf[i]][0]) > LowThAbs:
30                              isOne = False
31                              break
32              if isOne: WhichOnes.append(n)
33          return WhichOnes
34      def NewMeasurement(self,xhat,x=None):
35          if x is None: x=xhat
36          WhichOnes=self.WhichMeasurementTones(x,.2,0.9)
37          for n in WhichOnes:
38              r=self.m_ilv.m_R[n]
39              c=self.m_ilv.m_C[n]
40              t=self.m_ilv.m_T[n]
41              b=self.m_ilv.m_B[n]
42              xprimev=Matrix([])
43              xhatv=Matrix.initialized(0,self.m_ilv.m_I,1)
44              ti=[]
45              for i in range(self.m_ilv.m_I):
46                  if (n == r[i]): ti.append(i)
47                  if t[i] != 0: xprimev.list.append([x[r[i]][0].real +
48                          t[i]*1j*x[r[i]][0].imag])
49                  xhatv[i][0]=xhat[r[i]][0].real+c[i]*1j*xhat[r[i]][0].imag
50              self.m_Xhat[n] = self.m_Xhat[n].aug(xhatv)
51              self.m_Xprime[n] = self.m_Xprime[n].aug(xprimev)
52              if self.m_Xprime[n].rows() > self.m_Xprime[n].cols(): return
53              Hbprime=self.m_Xhat[n]*self.m_Xprime[n].dagger()
54              for i in range(self.m_ilv.m_I):
55                  for ci in range(len(ti)):
56                      self.m_Hb[b][i][ti[ci]]=Hbprime[i][ci]
57              v=self.m_Li[ti[0]]*Hbprime.col(0)
58              for i in range(self.m_ilv.m_I):
59                  self.m_H[n][i]=v[i][0].real+c[ti[0]]*1j*v[i][0].imag
```

FIG. 6

```
1   class InterleaveInfo():
2       def __init__(self,K,I):
3           self.m_I = I
4           N=K/2
5           p = [int(k/I)+int(K/I)*(k % I) for k in range(K)]
6           f = [[p[b*I+i] for i in range(I)]
7                for b in range(K/(2*I)+1)]
8           r = [[f[b][i] if f[b][i] <= N else N-(f[b][i]-N)
9                for i in range(I)] for b in range(K/(2*I)+1)]
10          c = [[1 if f[b][i] <= N else -1 for i in range(I)]
11               for b in range(K/(2*I)+1)]
12          self.m_NB = int(K/(2*I)+1)
13          self.m_B=[0 for n in range(N+1)]
14          for b in range(self.m_NB):
15              for i in range(I):
16                  self.m_B[r[b][i]]=b
17          self.m_R = [r[self.m_B[n]] for n in range(N+1)]
18          self.m_C = [c[self.m_B[n]] for n in range(N+1)]
19          self.m_T = [[self.m_C[n][i]
20               if self.m_R[n][i] == n else 0
21               for i in range(I)] for n in range(N+1)]
22          self.m_N = N
```

FIG. 7

```
1   import cmath
2   import math
3   from Matrix import Matrix
4
5   def LiCalc(I):
6       Li = []
7       for i in range(I):
8           thisLi = Matrix.initialized(0,I,I)
9           for r in range(I):
10              for c in range(I):
11                  thisLi[r][c]=cmath.exp(1j*((c-i)*r)*2.*math.pi/I)
12          Li.append(thisLi)
13      return Li
```

FIG. 8

```
1   from Matrix import Matrix
2
3   class InterleaveCorrector():
4       def __init__(self,Hb):
5           I = Hb[0].rows()
6           K = (len(Hb)-1)*2*I
7           self.m_Hbi = [Hbb.I() for Hbb in Hb]
8           self.m_I = I
9           N=K/2
10          p = [int(k/I)+int(K/I)*(k % I) for k in range(K)]
11          f = [[p[b*I+i] for i in range(I)]
12               for b in range(K/(2*I)+1)]
13          r = [[f[b][i] if f[b][i] <= N else N-(f[b][i]-N)
14               for i in range(I)] for b in range(K/(2*I)+1)]
15          c = [[1 if f[b][i] <= N else -1 for i in range(I)]
16               for b in range(K/(2*I)+1)]
17          self.m_r = r
18          self.m_c = c
19          self.m_NB = int(K/(2*I)+1)
20      def CorrectBuffer(self,Xhat):
21          X=Matrix.initialized(0,Xhat.rows(),1)
22          Xhatb=Matrix.initialized(0,self.m_I,1)
23          for b in range(len(self.m_Hbi)):
24              for i in range(self.m_I):
25                  rep = Xhat[self.m_r[b][i]][0].real
26                  imp = self.m_c[b][i]*1j*Xhat[self.m_r[b][i]][0].imag
27                  Xhatb[i][0]=rep+imp
28              Xb=self.m_Hbi[b]*Xhatb
29              for i in range(self.m_I):
30                  rep = Xb[i][0].real
31                  imp = self.m_c[b][i]*1j*Xb[i][0].imag
32                  X[self.m_r[b][i]][0]=rep+imp
33          K=X.rows()
34          N=K/2
35          for nn in range(1,N-1):
36              X[N+nn][0]=X[N-nn][0].conjugate()
37          return X
```

FIG. 9  PRIOR ART

METHOD AND APPARATUS FOR CORRECTION OF TIME INTERLEAVED ADCS

FIELD OF THE INVENTION

The present invention relates in general to the correction of systems of mismatched time interleaved digitizers, and more particularly to calibrations performed for measuring the response of digitizers and measuring the correction of systems of time interleaved digitizers.

CROSS REFERENCE TO RELATED APPLICATIONS

This application claims the benefit under 35 USC 119 of U.S. Provisional Patent Application Ser. No. 62/135,319 filed Mar. 19, 2015, titled "Method and Apparatus for Correction of Time Interleaved ADCs", currently pending, the contents thereof being incorporated herein by reference.

BACKGROUND OF THE INVENTION

The present invention relates generally to the operation of measurement instruments. More specifically, the invention relates to measurement instruments consisting of analog-to-digital converters (ADCs) which are used to sample and digitize an analog signal, converting the analog signal to a sequence of values whose magnitude represents the voltage of the signal and the time location in the sequence represents when the signal was sampled. Furthermore, the present invention relates to digitizing systems, which consist of multiple, interleaved ADCs.

Systems used to digitize analog signals utilize ADCs that sample an analog signal at a time specified by a sample clock that is fed to the ADC. On prescribed rising and/or falling edges of this sample clock, the ADC samples the analog signal providing a digital value at its output. This digital value is typically stored in a memory of some sort for later use.

Waveform digitizing systems such as digital oscilloscopes are used by scientists and engineers to build ever faster electronic equipment. Because the speed of electronic equipment continues to increase, there is an ever increasing demand for faster waveform digitizing systems. For very fast waveform digitizing requirements, the speed demands placed on waveform digitizing systems exceed the physical capabilities of ADCs. In other words, ADCs cannot sample signals fast enough to meet the demands of the electronics industry and the scientific community.

In order to overcome this physical limitation and make waveform digitizing systems that sample signals at a higher rate, a technique called time interleaving is often used. Interleaving involves the usage of multiple ADCs in a waveform digitizing system. These ADCs are used in a manner in which generally all ADCs sample at the same rate, but they sample the signal at different times. For example, a waveform digitizing system utilizing two ADCs could sample a signal at an effective sample rate equal to the sum of each ADC sample rate if each ADC took every other sample of the signal. At the end of such a waveform acquisition, the resulting array of data points would contain data where half of the data were generated from one ADC and the other half from the other. More specifically, every other point in the resulting acquired signal would have been acquired by one of the ADCs while the remaining points were acquired by the other. This method of interleaving ADCs has been used with great success.

While bandwidth and sample rates of waveform digitizer systems are perhaps the most important qualities, signal fidelity is equally important. In other words, the waveform digitizing system is expected to produce a digital representation of the sampled analog waveform with a high degree of accuracy. Said differently, the digitizing system is expected to faithfully reproduce an image of the analog signal being digitized. In systems utilizing a single ADC to digitize a waveform, the problem of faithful reproduction of the analog signal reduces to the solution of engineering problems in the design of the digitizer system involving front-end non-linearity and noise, ADC integral and differential non-linearity, sample clock accuracy and stability etc. In interleaved systems, these problems are exacerbated by the use of multiple digitizers.

In interleaved systems, to avoid degradation, the signal path to each digitizer must have identical characteristics. Any time delay, attenuation or gain applied differently in the path to each digitizer will result in noticeable degradation of the quality of the acquired signal. The same must be said for the sample clock delivery to the digitizers. Any variation in the timing from digitizer to digitizer will reduce the signal quality. Furthermore, each digitizer or ADC in an interleaved system will have characteristics that may vary from the other digitizers, the most important characteristic being frequency response. Differing frequency response manifests itself as a mismatching gain and time, or phase delay of the signal at various frequencies. Differences in frequency response are more likely at higher frequencies where digitizer matching becomes more difficult. As mentioned previously, high bandwidth is another feature desired of digitizing systems, and high bandwidth means that high frequency signals or signals with components at high frequencies are being digitized. This means that matching digitizer frequency response characteristics is a particular problem in high bandwidth systems that are used to digitize high frequency signals.

The current state of technology deals with these problems in several ways. In the design of a digital oscilloscope or other waveform digitizing system, good engineering practice is applied to ensure that the sample clock does not jitter and is delivered accurately to each digitizer. Furthermore, the paths to each digitizer are carefully designed and routed to provide as good signal path matching as practically possible. Finally, demands are placed on the design of ADC chips to meet stringent frequency response specifications.

Additionally, ADCs are sometimes built with controls provided to precisely adjust the offset, gain, and sample clock delay to the ADC. Some systems dynamically measure and adjust the offset, gain and delay characteristics of the individual digitizers in the interleaved system using internal calibration signals and hardware controls. Even with the provision of these controls, it is still impossible to adjust for gain and delay characteristics of the digitizers that vary with frequency.

An effect of mismatched digitizers is the creation of spurs that degrade signal fidelity and effective number of bits (ENOB).

To deal with frequency dependent interleaved digitizer mismatch, several methods have been proposed.

In U.S. Pat. No. 7,978,104, filed Jun. 21, 2007 titled "Compensation of Mismatch Errors in a Time-interleaved Analog-to-digital Converter" to Johansson, a time-domain polyphase filter is disclosed for performing interleave correction.

In U.S. Pat. No. 6,567,030, filed Feb. 27, 2002, titled "Sample Synthesis for Matching Digitizers in Interleaved Systems" to Pupalaikis, a feedback structure is employed for performing interleave correction.

In U.S. Pat. No. 6,819,279, filed Mar. 5, 2003, titled "Method and Apparatus for the Recovery of Signals Acquired by an Interleaved System of Digitizers with Mismatching Frequency Response Characteristics" to Pupalaikis, a frequency-domain correction method preferably employing the discrete Fourier transform (DFT) is disclosed.

In U.S. Pat. No. 7,386,409, filed Nov. 16, 2005, titled "Method and Apparatus for Artifact Signal Reduction in Systems of Mismatched Interleaved Digitizers" to Mueller, et al, a time-domain, filter based system for directly targeting spur tones is disclosed.

These methods attempt to compensate for error due to interleave mismatch, but require a priori knowledge of the digitizer mismatch characteristics. This a priori knowledge can be gained by factory calibration with reference signals or during internal instrument calibration utilizing built in standards. Factory calibration is possible in some instruments such as oscilloscopes, but this calibration degrades over time due to temperature and drift. Internal calibration signals are generally expensive, especially for very high frequencies and internal calibration must generally be performed with the digitizers offline.

What is needed are methods of determining correction information for use with, for example, the aforementioned methods utilizing user signals applied to the system during normal operation.

In U.S. Pat. No. 7,741,982, filed Feb. 4, 2005, titled "Estimation of Timing Errors in a Time-interleaved Analog-to-digital Converter System" to Johansson, et al., a method is provided for specifically estimating timing errors for incorporation into a correction, but there are limitations on signals usable for estimation of timing errors that are onerous and not generally applicable to time-interleaved systems and anyway only addresses timing error or delay match.

Some methods include U.S. Pat. No. 8,441,379, filed Feb. 11, 2009 titled "Device and Method for Digitizing a Signal" to Eklund et al. This method provides for on-the-fly correction for interleave error but pertains to sub-banded acquisition systems containing overlapping sub-bands and does not pertain to the general time-interleaving problem.

In U.S. Pat. No. 8,307,248, filed Jun. 30, 2006 titled "Method and a System for Estimating Errors Introduced in a Time-interleaved Analog-to-digital Converter System" to Johansson et al, the inventors provide means for on-the-fly calibration of an interleave correction system using unknown input signals, but the method is an iterative, loss minimization method pertaining to gain, offset and delay mismatch. Thus, a loss function representing a difference between a reference signal and remaining signals is employed. While gain, offset and delay mismatch are certainly important criteria in interleaved digitizer matching, the frequency dependent aspects are also of importance and the invention does not address this. Furthermore, the loss function is such that it is used in an estimation that minimizes the differences between a reference and remaining signals and does not directly address spur tones arising from interleave mismatch.

The inventors of the present invention have recognized that these methods each suffer from combinations of problems including lack of handling of frequency dependent digitizer mismatch as occurs from general frequency response mismatch, lack of directly targeting spurious tones arising from interleave mismatch, requirements for different topologies such as sub-banded architectures, and iterative non-linear equation solving methods.

What is needed is a system for on-the-fly correction for interleave mismatch that provides for correction of frequency dependent effects and directly targets spurious tones arising from said mismatch. What is further needed is a system that is capable of correction based on user supplied signals.

OBJECTS OF THE INVENTION

It is an object of this invention to provide a system capable of determining frequency dependent corrections for interleave mismatch from on-the-fly calibration utilizing user supplied signals. It is further an object to determine these corrections in a manner that directly targets reduction of spurious tones. It is further an object to provide means for performing such corrections using efficient methods.

Still other objects and advantages of the invention will in part be obvious and will in part be apparent from the specification and drawings.

SUMMARY OF THE INVENTION

In order to provide a system capable of determining frequency dependent corrections for interleave mismatch from on-the-fly calibration utilizing user supplied signals, a system is provided that converts a time-domain input stream containing a stream of input data acquired by a system of interleaved digitizers and impaired by interleave error into a substantially corrected time-domain output stream through the use of an interleave corrector whose method of correction is one of many time-domain, frequency-domain or filtering operations based on estimations or calculations of the impairment due to interleave error. A time-domain acquisition segment is picked off from the time-domain input stream and converted to a frequency-domain acquisition segment. This frequency-domain acquisition segment is grouped into one or more frequency-domain block acquisition segments containing grouped tones in accordance with the predetermined interleave architecture. In one embodiment, a frequency-domain block acquisition segment is preferably accompanied by a frequency-domain ideal block segment indicative of the known, corrected signal corresponding to the frequency-domain block acquisition segment. In another embodiment, a block dominant tone segment is preferably determined from a block dominant tone determiner which uses the detection of dominant tones and suitability for calibration from the frequency-domain block acquisition segment. The frequency-domain block acquisition segment and, depending on the embodiment, the frequency-domain ideal block segment or block dominant tone segment is utilized in either a block impairment transfer matrix calculator or a block impairment transfer column vector calculator resulting in the production of a result placed in a block impairment transfer matrix repository, with the latter intermediate result corresponding to a response of all digitizers to a single frequency in a digitizer frequency response matrix.

The present invention is therefore capable of producing block impairment transfer matrices, an impairment transfer matrix, and/or a digitizer frequency response matrix, any one of these can be provided as one of several possible interleave correction data input to the interleave corrector, thus enabling the system to convert a time-domain input stream to a time-domain output stream through the use of an interleave corrector and provide substantial correction for interleave error. It can be demonstrated that all of the block impairment transfer matrices, impairment transfer matrix, and/or a digitizer frequency response matrix can be transformed to a form to provide for frequency dependent interleave correction according to many of the methods put forth in prior art and mentioned in the background or in accordance with one or more embodiments of the present invention.

Because an embodiment utilizes a block dominant tone segment that is determined from a block dominant tone determiner in conjunction with a frequency-domain block acquisition segment, it can be shown that the invention directly targets reduction of spurious tones when suitable user signals are applied. Many embodiments are described for solving for corrections that minimize the spurious tones in a least-squares, or minimum norm sense. The efficiency of these methods for performing such corrections shall be demonstrated in the detailed description of the preferred embodiments along with various other possibilities.

The invention accordingly comprises the several steps and the relation of one or more of such steps with respect to each of the others, and the apparatus embodying features of construction, combinations of elements and arrangement of parts that are adapted to affect such steps, all is exemplified in the following detailed disclosure, and the scope of the invention will be indicated in the claims.

BRIEF DESCRIPTION OF THE DRAWINGS

For a more complete understanding of the invention, reference is made to the following description and accompanying drawings, in which:

FIG. 6 is a Python program listing which provides for a class which provides for on-the-fly interleave correction through the provision of interleave correction data input for use by an interleave corrector;

FIG. 7 is a Python program listing which provides for pre-calculated interleave correction information;

FIG. 8 is a Python program listing which provides for pre-calculation of matrices used to convert between interleave correction data of different forms; and FIG. 9 is a Python program listing which provides for an implementation of an interleave corrector which corrects frequency-domain acquisition segments from a time-domain input stream to produce substantially corrected frequency-domain ideal segments which can be used to produce a substantially corrected time-domain output stream utilizing block impairment transfer matrices.

DETAILED DESCRIPTION OF THE PREFERRED EMBODIMENTS

Figure 2:
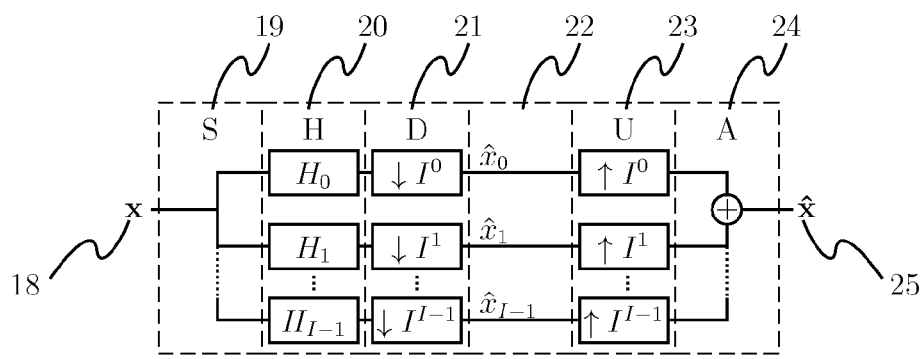
FIG. 2 is a model depicting problems in systems of time-interleaved ADCs.

The inventors of the present invention have determined that an appropriate model for a system of time-interleaved ADCs is shown in FIG. 2. The model contains an input vector [18] representative of an input waveform to be digitized. The input data stream is split by a splitter [19] which distributes the same input waveform to each of I interleaved digitizers. The digitizer frequency responses [20] depict the responses for each of the interleaved digitizers. The decimator [21] decimates the stream of data.

With regards to the decimator [21], a decimation factor of I means that one keeps every $I'$ sample of the stream. The sample phase determines how many samples are skipped before keeping the first sample. In other words, a sample phase of 0 means that one keeps sample 0, I, 2I, etc. from the data stream. A sample phase of 1 means that one keeps sample 1, I+1, 2I+1, etc. The symbol used for decimation is a down arrow followed by the decimation factor with the sample phase superscripted. In other words, $\downarrow I^{\Phi}$ means to decimate by I with a sample phase of $\Phi$.

These I decimated data streams are identical to the data sampled from an analog signal by a system of I digitizers under certain circumstances. The inventors recognize that in reality data is sampled by independent digitizers on an analog signal. Here, the data has already been sampled, the data stream split and each of these decimated. The result is the same under each situation presuming the originally sampled signal in the input vector [18] meets the well known Nyquist criteria of the overall, interleaved system.

The digitizer sample vectors [22] shows the data stream at the output of each of the digitizers. If the input vector [18] were to be sampled at the full rate indicative of the interleaved system, then digitizer sample vectors [22] provides for samples indicative of the output of each of the digitizers prior to interleaving. The upsampler [23] and adder [24] provide the interleaving effect as the upsampler [23] takes each of the digitizer sample vectors [22] and adds I−1 zeros between each sample with, for i∈0 . . . I−1, a sample phase of i. To be clear, for an input vector [18] of length K, the digitizer sample vectors [22] will have length K/I due to decimator [21]. The upsampler [23] restores the vectors in digitizer sample vectors [22] to length K. This is an addition of K−K/I=(K/I)·(I−1) zero samples, or I−1 zero samples for each of the K/I samples in each of the vectors in digitizer sample vectors [22]. For a sample phase of 0, I−1 zero samples are added after each sample. For a sample phase of 1, one zero sample is added before the first sample in the vector, and I−1−1 zero samples are added after the last sample in the vector. For a sample phase, therefore, of i, one has i zero samples added before the first sample in the vector and I−1−i zero samples added after the last sample in the vector. In this manner, upsampling is achieved through zero insertion that restores the K/I samples in each vector in digitizer sample vectors [22] to K sample vectors.

The symbol used for upsampling is an up arrow followed by the upsampling factor with the sample phase superscripted. In other words, $\downarrow I^{\Phi}$ means to upsample by I with a sample phase of $\Phi$.

Finally the adder [24] adds all of the vectors to form the output vector [25]. Note that because of the upsampling action with various sample phases, the effect of the upsampler [23] and adder [24] is to provide for a K element output vector [25] that contains the digitizer sample vectors [22] time-interleaved.

The interleaving problem occurs when the blocks $H_i$ in the digitizer frequency responses [20] are not identical. If the blocks in digitizer frequency responses [20] are identical, but not unity, then the overall system will have a non-flat frequency response that can be restored through standard filtering operations, but when the blocks in digitizer frequency responses [20] are not identical, one has interleaving artifacts. These artifacts are spur tones (due to a single input tone) at various frequencies that will be explained subsequently. These spur tones cannot be eliminated through standard single-phase filtering techniques.

FIG. 2 shows the interleaving situation diagrammatically or, as put forth, from a digital signal processing (DSP) perspective. The inventors find it particularly beneficial to view the interleaving problem from a matrix-algebra standpoint.

The inventors of the present method have determined that a representation of the general interleave problem can be shown as:

$$\hat{x} = \overset{a}{P}_{K,I} \cdot \overset{u}{P}_{K,I} \cdot \overset{d}{P}_{K,I} \cdot \left( I \otimes \mathcal{F}_K^{-1} \right) \cdot \text{diag}_c(H) \cdot \left( I \otimes \mathcal{F}_K \right) \cdot \overset{s}{P}_{K,I} \cdot x \quad (1)$$

A K element time-domain vector x contains sample points at the full interleaved sample rate, as if an analog signal that meets the Nyquist criteria for the overall system sample rate has been sampled at the overall system sample rate such that $x_{[k/Fs]} = f(k/Fs) \cdot \delta(t-k/Fs)$ where Fs is the overall system sample rate, $k \in 0 \ldots K-1$ is the sample index in the vector, $f(t)$ is an input analog signal, and $\delta(t)$ is the Dirac-delta function. A K element time-domain vector $\hat{x}$ contains the same sample points at the full interleaved sample rate, but as if the analog signal has been sampled by I digitizers with frequency response given by H, which will be explained subsequently. H is referred to as a digitizer frequency response matrix, although when the term digitizer frequency response matrix is used, one is referring to any structure containing the frequency response of multiple digitizers and are not limited to the specific structure of H provided in (1). In other words, any structure containing the frequency response of multiple interleaved digitizers can be thought to be equivalent to a digitizer frequency response matrix.

$\hat{x}$ is referred to as a time-domain acquisition segment and x as a time-domain ideal waveform segment, this because when an ideal waveform x, called ideal because it does not contain interleave impairment is applied in (1) (i.e. applied to a system of mismatched, interleaved digitizers), the result is an acquisition as in $\hat{x}$. The goal of any correction system is to substantially recover the ideal waveform from the acquired waveform.

A split matrix is defined as a K·I×K element matrix that is zero everywhere except, for $k \in 0 \ldots K-1$, $i \in 0 \ldots I-1$:

$$\overset{s}{P}_{K,I\,[k+i\cdot K][k]} = 1 \quad (2)$$

The notation $\overset{I}{K}$ means a K×K element identity matrix. I is the number of interleaved digitizers in the system.

A decimate matrix is defined as a K×K·I element matrix that is zero everywhere except, for $k \in 0 \ldots K/I-1$, $i \in 0 \ldots I-1$:

$$\overset{d}{P}_{K,I\,[k+i\cdot\frac{K}{I}][k\cdot I+i+K\cdot i]} = 1 \quad (3)$$

An upsample matrix is defined as a K·I×K element matrix that is zero everywhere except, for $k \in 0 \ldots K/I-1$, $i \in 0 \ldots I-1$:

$$\overset{u}{P}_{K,I\,[k\cdot I+i+K\cdot i][k+\frac{K}{I}]} = 1 \quad (4)$$

An add matrix is defined as a K×K·I element matrix that is zero everywhere except, for $k \in 0 \ldots K/I-1$, $i \in 0 \ldots I-1$:

$$\overset{a}{P}_{K,I\,[k][k+i\cdot K]} = 1 \quad (5)$$

Note that the nomenclature used here is that permutation matrices are ones that transform vectors or matrices by expanding, reducing, and/or rearranging elements. As such, they generally contain only zeros and ones, where the location of the ones determines the permutation. A notation is used whereby a permutation matrix is denoted as P with the type of permutation sitting on top and the variables that determine the matrix in detail on the bottom.

Also, all matrix or vector indices are utilized by subscripting the matrix or vector with [i] which indicates element i. Thus, to obtain element i from vector a, $a_{[i]}$ written. To obtain the element at row r and column c of matrix A, $A_{[r][c]}$ is written. Matrices are generally written in bold, uppercase letters and vectors are generally written in bold, lowercase letters. Exceptions will generally be noted. All indices in this document are zero based meaning that the first element of an R element vector a is accessed as $a_{[0]}$ and the last element is accessed as $a_{[R-1]}$.

A Fourier matrix is defined as, for n, $k \in 0 \ldots K-1$:

$$\mathcal{F}_{K\,[n][k]} = \frac{1}{K} \cdot e^{-j2\pi\frac{nk}{K}} \quad (6)$$

The operator $\otimes$ denotes the Kronecker product and the Kronecker product of an I×I element identity matrix and another matrix A is defined as:

$$\underset{I}{I} \otimes A = \text{diag}\left( \begin{bmatrix} A \\ A \\ \vdots \\ A \end{bmatrix}_{I \times 1} \right) = \begin{pmatrix} A & 0 & 0 & 0 \\ 0 & A & 0 & 0 \\ 0 & 0 & \ddots & 0 \\ 0 & 0 & 0 & A \end{pmatrix}_{I \times I} \quad (7)$$

The resulting matrix is block I×I.

The individual digitizer responses are defined as H with the understanding that H is a K×I element matrix where $H_{[k][i]}$ represents the response of digitizer i at frequency bin k in the DFT of x. A modified diag operator is further defined, that diagonalizes the columns of H such that $\text{diag}_c(H)$ is a K·I×K·I matrix that is zero everywhere except along the diagonal where for $r \in 0 \ldots K \cdot I-1$:

$$\text{diag}_c(H)_{[r][r]} = H_{[\text{mod}(r,K)][\text{floor}(r/K)]} \quad (8)$$

or:

$$\text{diag}_c(H) = \begin{pmatrix} \text{diag}(H_{[*][0]}) & 0 & \cdots & 0 \\ 0 & \text{diag}(H_{[*][1]}) & \cdots & 0 \\ \vdots & \vdots & \ddots & \vdots \\ 0 & 0 & \cdots & \text{diag}(H_{[*][I-1]}) \end{pmatrix} \quad (9)$$

where the function floor (x) provides the largest integer value less than or equal to the real valued x and floor $$\binom{k}{l}$$

defines a block number. The function mod (x, y) provides x modulo y and is defined as:

$$\mod(x, y) \equiv \left[\frac{x}{y} - \text{floor}\left(\frac{x}{y}\right)\right] \cdot y \quad (10)$$

The notation $A_{[*][i]}$ means column i of A (whereas the notation $A_{[i][*]}$ would mean row i of A).

The diag operator is understood to take a vector and to create a matrix that is zero everywhere except the elements of that vector placed on the diagonal.

The equation in (1) can be expressed in the frequency-domain as:

$$\hat{X} = \underset{K}{\mathcal{F}} \cdot \underset{K,l}{\overset{a}{P}} \cdot \underset{K,l}{\overset{u}{P}} \cdot \underset{K,l}{\overset{d}{P}} \cdot \left(I_l \otimes \underset{K}{\mathcal{F}}^{-1}\right) \cdot \text{diag}_c(H) \cdot \underset{K,l}{\overset{s}{P}} \cdot X \quad (11)$$

In (11), $$X = DFT(x) = \underset{K}{\mathcal{F}} \cdot x \text{ and } \hat{X} = DFT(\hat{x}) = \underset{K}{\mathcal{F}} \cdot \hat{x},$$

where DFT (x) is the DFT of x.

Regarding nomenclature, it is common in DSP to refer to vectors of time-domain sequences with bold, lowercase letters and vectors of frequency-domain data with bold, uppercase letters. This notation is kept, despite its confusion with vectors and matrices.

Here one refers to X as a frequency-domain ideal waveform segment, because it contains a frequency-domain representation of a time-domain ideal waveform segment and the term frequency-domain ideal waveform segment applies to any equivalent frequency-domain structure. One refers to $\hat{X}$ as a frequency-domain acquisition segment because it contains a frequency-domain representation of a time-domain acquisition segment acquired from the system with a given interleave error impairment and such, the term frequency-domain acquisition segment refers to any frequency-domain structure.

Thus, one can define an impairment transfer matrix as:

$$\mathbb{H} = \underset{K}{\mathcal{F}} \cdot \underset{K,l}{\overset{a}{P}} \cdot \underset{K,l}{\overset{u}{P}} \cdot \underset{K,l}{\overset{d}{P}} \cdot \left(I_l \otimes \underset{K}{\mathcal{F}}^{-1}\right) \cdot \text{diag}_c(H) \cdot \underset{K,l}{\overset{s}{P}} \quad (12)$$

such that:

$$\hat{X} = \mathbb{H} \cdot X \quad (13)$$

Here, a frequency-domain observation or acquisition is $\hat{X}$ due to the application of the impairment transfer matrix $\mathbb{H}$ to the actual or correct frequency-domain signal X applied to the system.

Past methods of performing interleave correction are similar in nature to measuring H which leads to $\mathbb{H}$ which leads to a correction that can be performed on acquired frequency content to produce the actual input frequency content:

$$X = \mathbb{H}^{-1} \cdot \hat{X} \quad (14)$$

Matrices X and $\hat{X}$ are defined to be K×M element matrices where each of the M columns is a K element DFT vector containing a known frequency content of a signal and the acquired frequency content due to non-ideal interleaved digitizer responses, respectively:

$$\hat{X} = \mathbb{H} \cdot X \quad (15)$$

If an ensemble of acquired measurements $\hat{X}$ and associated known applied waveforms X is rich enough, then a way to determine the impairment transfer matrix is to determine:

$$\mathbb{H} = \hat{X} \cdot X^\dagger \quad (16)$$

or the correction transfer matrix as:

$$\mathbb{H}^{-1} = X \cdot \hat{X}^\dagger \quad (17)$$

Note that the terms impairment transfer matrix and correction transfer matrix refer to any structure capable of converting between an ideal, substantially correct, unimpaired signal and an impaired signal due to interleave error and although (15) refers to a specific relationship, an impairment transfer matrix and correction transfer matrix refers to any equivalent structure capable of a similar conversion as in (15). These structures include frequency-domain, time-domain and filtering operations.

The richness of the acquired and known waveforms is determined by the existence of $X^\dagger$ or $\hat{X}^\dagger$ where the † operator is the Moore-Penrose pseudo-inverse defined as, for an R×C element matrix A:

$$A^\dagger \equiv \begin{cases} A^{-1} & R = C \\ (A^H \cdot A)^{-1} \cdot A^H & R > C \\ A^H \cdot (A \cdot A^H)^{-1} & R < C \end{cases} \quad (18)$$

Notationally, $A^{-1}$ represents the well known inverse of the matrix A. $A^H$ represents the Hermitian or conjugate transpose of A and is equivalent to $(A^T)^*$, where the notation $A^T$ represents the transpose of A and the notation A* represents the matrix containing the complex conjugate of every element in A. The complex conjugate of a complex number x is defined as:

$$x^* = Re(x) - j \cdot Im(x) \quad (19)$$

The notation Re(x) refers to the real part of x and Im(x) refers to the imaginary part of x. j represents the electrical engineering notation for the imaginary number $\sqrt{-1}$.

The inventors have determined that, while (16) and (17) provide for viable ways of performing on-the-fly correction, these equations have certain limitations. One is the requirement of richness of data that determine the invertibility of X and/or $\hat{X}$. Another is the exact knowledge of X required. In this manner, multiple measurements of $\hat{X}$ are acquired and coupled with multiple known input signals X. By creating augmented matrices $\hat{X}$ and X from these multiple measurements, the interleave correction matrix $\mathbb{H}^{-1}$ is determined using (17). $\hat{X}$ and X are referred to as an accumulated frequency-domain acquisition buffer and an accumulated frequency-domain known buffer, respectively. This correction matrix is then applied using (14) to calculate the corrected values for X given acquired values of $\hat{X}$. The inventors have determined that there are more preferable ways to perform the on-the-fly corrections.

The inventors have determined that the matrix $\mathbb{H}$ is observed to be banded in nature and consists of diagonal stripes. A block permutation matrix $\overset{b}{\underset{K,l}{P}}$ is defined as a K×K element matrix that is zero everywhere except, for k∈0 . . . K−1:

$$\overset{b}{P}_{K,I_{[k]\left[\text{floor}\left(\frac{k}{I}\right)+\frac{K}{I}\cdot\text{mod}(k,I)\right]}} = 1 \qquad (20)$$

Applying this block permutation matrix, recognizing that $$\overset{b}{P}_{K,I}^{T} \cdot \overset{b}{P}_{K,I} = I_K, \qquad (21)$$

one obtains:

$$\hat{X} = \overset{b}{P}_{K,I}^{T} \cdot \overset{b}{P}_{K,I} \cdot H \cdot \overset{b}{P}_{K,I}^{T} \cdot \overset{b}{P}_{K,I} \cdot X \qquad (21)$$

The new permuted impairment transfer matrix is now defined as:

$$\overset{b}{\mathring{H}} = \overset{b}{P}_{K,I} \cdot H \cdot \overset{b}{P}_{K,I}^{T} \qquad (22)$$

Substituting (22) into (12):

$$\overset{b}{\mathring{H}} = \overset{b}{P}_{K,I} \cdot \mathcal{F}_K^{\cdot} \cdot \overset{a}{P}_{K,I} \cdot \overset{u}{P}_{K,I} \cdot \overset{d}{P}_{K,I} \cdot \left(I_I \otimes \mathcal{F}_K^{-1}\right) \cdot \text{diag}_c(H) \cdot \overset{s}{P}_{K,I} \cdot \overset{b}{P}_{K,I}^{T} = \qquad (23)$$

$$\text{diag}\begin{bmatrix} \begin{pmatrix} \overset{b}{\mathring{H}}_{[0]} \\ \overset{b}{\mathring{H}}_{[1]} \\ \vdots \\ \overset{b}{\mathring{H}}_{[\frac{K}{2I}-1]} \\ \overset{b}{\mathring{H}}_{[\frac{K}{2I}]} \\ \overset{b}{\mathring{H}}_{[\frac{K}{2I}+1]} \\ \vdots \\ \overset{b}{\mathring{H}}_{[\frac{K}{I}-2]} \\ \overset{b}{\mathring{H}}_{[\frac{K}{I}-1]} \end{pmatrix} \end{bmatrix}$$

Thus, $\overset{b}{\mathring{H}}$ has a block structure containing K/I I×I matrices on the diagonal. Note that notationally, block b along the diagonal of $\overset{b}{\mathring{H}}$ is described as $\overset{b}{\mathring{H}}_{[b]}$ (not as $\overset{b}{\mathring{H}}_{[b][b]}$ to make the math read a bit easier. Each $\overset{b}{\mathring{H}}_{[b]}$ is called a block impairment transfer matrix since it implements the interleave impairment by operating on blocks of interleave related tones.

Similarly, one can define:

$$\overset{b}{X} = \overset{b}{P}_{K,I} \cdot X \qquad (24)$$

and $$\overset{b}{\hat{X}} = \overset{b}{P}_{K,I} \cdot \hat{X} \qquad (25)$$

such that $$\overset{b}{\hat{X}} = \overset{b}{\mathring{H}} \cdot \overset{b}{X} \qquad (26)$$

or for an ensemble of measurements:

$$\overset{b}{\hat{\mathbb{X}}} = \overset{b}{\mathring{H}} \cdot \overset{b}{\mathbb{X}} \qquad (27)$$

In following with the structure of $\overset{b}{\mathring{H}}$, one partitions $\overset{b}{\hat{X}}$, $\overset{b}{X}$, $\overset{b}{\hat{\mathbb{X}}}$, and $\overset{b}{\mathbb{X}}$ into vectors or matrices with I rows. M is preferably defined as the number of measurements in $\overset{b}{\hat{\mathbb{X}}}$ and $\overset{b}{\mathbb{X}}$ (i.e. the number of columns where each column is a $\overset{b}{\hat{X}}$ or $\overset{b}{X}$). For b∈0 ... K/I−1:

$$\overset{b}{\hat{X}}_{[b]} = \text{submatrix}\left(\overset{b}{P}_{K,I} \cdot \hat{X}, b \cdot I, b \cdot I + I - 1, 0, 0\right) \qquad (28)$$

$$\overset{b}{X}_{[b]} = \text{submatrix}\left(\overset{b}{P}_{K,I} \cdot X, b \cdot I, b \cdot I + I - 1, 0, 0\right) \qquad (29)$$

$$\overset{b}{\hat{\mathbb{X}}}_{[b]} = \text{submatrix}\left(\overset{b}{P}_{K,I} \cdot \hat{\mathbb{X}}, b \cdot I, b \cdot I + I - 1, 0, M - 1\right) \qquad (30)$$

$$\overset{b}{\mathbb{X}}_{[b]} = \text{submatrix}\left(\overset{b}{P}_{K,I} \cdot \mathbb{X}, b \cdot I, b \cdot I + I - 1, 0, M - 1\right) \qquad (31)$$

where the function submatrix (A, $r_i, r_f, c_i, c_f$) extracts the rows from $r_i$ to $r_f$ inclusively and the columns from $c_i$ to $c_f$ inclusively from matrix A, such that they have the structure:

$$\overset{b}{\hat{X}} = \begin{pmatrix} \overset{b}{\hat{X}}_{[0]} \\ \overset{b}{\hat{X}}_{[1]} \\ \vdots \\ \overset{b}{\hat{X}}_{[\frac{K}{2I}-1]} \\ \overset{b}{\hat{X}}_{[\frac{K}{2I}]} \\ \overset{b}{\hat{X}}_{[\frac{K}{2I}+1]} \\ \vdots \\ \overset{b}{\hat{X}}_{[\frac{K}{I}-2]} \\ \overset{b}{\hat{X}}_{[\frac{K}{I}-1]} \end{pmatrix} \qquad (32)$$

-continued $$\overset{b}{X} = \begin{pmatrix} \overset{b}{X}_{[0]} \\ \overset{b}{X}_{[1]} \\ \vdots \\ \overset{b}{X}_{[\frac{K}{2 \cdot I}-1]} \\ \overset{b}{X}_{[\frac{K}{2 \cdot I}]} \\ \overset{b}{X}_{[\frac{K}{2 \cdot I}+1]} \\ \vdots \\ \overset{b}{X}_{[\frac{K}{I}-2]} \\ \overset{b}{X}_{[\frac{K}{I}-1]} \end{pmatrix} \quad (33)$$

One refers to $\overset{b}{\hat{X}}_{[b]}$ as a frequency-domain block acquisition segment, $\overset{b}{X}_{[b]}$ as a frequency-domain ideal block segment, $\overset{b}{\hat{X}}_{[b]}$ as an accumulated frequency-domain block acquisition segment, and $\overset{b}{\check{X}}_{[b]}$ as an accumulated frequency-domain known block segment, where each of these terms are used to describe generally structures containing acquired and ideal, non-accumulated and accumulated groupings of frequency-domain tones coming from a system of interleaved digitizers and whose tone grouping, as the reader shall see, are dependent on the interleave architecture.

Because of the structure of $\overset{b}{\hat{H}}$ one finds that the interleave correction problem is now broken down into several smaller equations where for b∈0 . . . K/I−1:

$$\overset{b}{\hat{X}}_{[b]} = \overset{b}{\hat{H}}_{[b]} \cdot \overset{b}{X}_{[b]} \quad (34)$$

Therefore, a way to determine the correction matrix is to acquire multiple measurements of $\hat{X}$ as before coupled with multiple known input signals X. These are converted to $\overset{b}{\hat{X}}$ and $\overset{b}{X}$ using (24) and (25). Then, augmented matrices $\overset{b}{\hat{X}}$ and $\overset{b}{X}$ are formed from these multiple measurements and for each block matrix, one can compute:

$$\overset{b}{\hat{H}}_{[b]} = \overset{b}{\hat{X}}_{[b]} \cdot (\overset{b}{X}_{[b]})^\dagger \quad (35)$$

$$(\overset{b}{\hat{H}}_{[b]})^{-1} = \overset{b}{X}_{[b]} \cdot (\overset{b}{\hat{X}}_{b})^\dagger \quad (36)$$

One refers to $\overset{b}{\hat{H}}_{[b]}$ as a block impairment transfer matrix.

This simplifies the problem in many ways. First, there are many common situations (such as the application of single or multiple tones to the system) where for many values of b, $\overset{b}{X}_{[b]}$ or $\overset{b}{\hat{X}}$ is all zero, so adding these to the augmented matrices is not useful and only serves to complicate things. Second, these multiple, smaller matrices require less computation. Third, the block form of $\overset{b}{\hat{H}}$ is enforced and the zeros in it are enforced. Finally, for some b, some matrices $\overset{b}{\hat{H}}_{[b]}$ or $(\overset{b}{\hat{H}}_{[b]})^{-1}$ cannot be determined depending on the richness of data and the existence of $(\overset{b}{\hat{X}}_{[b]})^\dagger$ or $(\overset{b}{\hat{X}}_{[b]})^\dagger$. In these cases, $\overset{b}{\hat{H}}_{[b]}$ or $(\overset{b}{\hat{H}}_{[b]})^{-1}$ can be set to the identity matrix $I$ and when matrix $\overset{b}{\hat{H}}$ or $(\overset{b}{\hat{H}})^{-1}$ is reassembled from each of the $\overset{b}{\hat{H}}_{[b]}$ or $(\overset{b}{\hat{H}}_{[b]})^{-1}$, and further possibly permuted to matrices $\mathbb{H}$ or $\mathbb{H}^{-1}$, thus the correction has been properly determined for blocks of frequencies encountered by the correction algorithm.

The inventors have determined that still other ways exist for performing the correction.

An observation made by the inventors is the structure of $\overset{b}{\hat{H}}$. The inventors find yet another symmetry that is similar to the symmetry found in a full-size frequency response (i.e. frequency responses consisting of positive and negative frequencies as commonly produced by the DFT and the fast Fourier transform (FFT)). One finds that block 1 and K/I−1 are related in that the block at K/I−1, if the rows and columns are flipped, is the complex conjugate of block 1. Similarly for block 2 and block K/I−2, etc. Thus, if one defines a permutation matrix $\overset{rc}{P}_I$ such that for the I rows (and columns) of $\overset{b}{\hat{H}}_{[b]}$, $\overset{rc}{P}_I$ is zero everywhere except, for i∈0 . . . I−1:

$$\overset{rc}{P}_{I\,[i][I-i-1]} = 1 \quad (37)$$

or, in other words:

$$\overset{rc}{P}_I = \begin{pmatrix} 0 & \cdots & 0 & 1 \\ 0 & \cdots & 1 & 0 \\ \vdots & \ddots & \vdots & \vdots \\ 1 & \cdots & 0 & 0 \end{pmatrix}_{I \times I} \quad (38)$$

Then the structure of $\overset{b}{\hat{H}}$ is therefore:

$$\overset{b}{\mathbb{H}} = \text{diag} \begin{bmatrix} \overset{b}{\mathbb{H}}_{[0]} \\ \overset{b}{\mathbb{H}}_{[1]} \\ \vdots \\ \overset{b}{\mathbb{H}}_{[\frac{K}{2 \cdot I}-1]} \\ \overset{b}{\mathbb{H}}_{[\frac{K}{2 \cdot I}]} \\ \overset{rc}{P}_I \cdot (\overset{b}{\mathbb{H}}_{[\frac{K}{2 \cdot I}-1]})^* \cdot \overset{rcT}{P}_I \\ \vdots \\ \overset{rc}{P}_I \cdot (\overset{b}{\mathbb{H}}_{[2]})^* \cdot \overset{rcT}{P}_I \\ \overset{rc}{P}_I \cdot (\overset{b}{\mathbb{H}}_{[1]})^* \cdot \overset{rcT}{P}_I \end{bmatrix} \quad (39)$$

Thus, only the $(\overset{b}{\hat{H}}_{[b]})^{-1}$ for b∈0 . . . K/(2·I) need be calculated directly.

$$\overset{b}{\hat{X}} = \begin{pmatrix} \overset{b}{\hat{X}}_{[0]} \\ \overset{b}{\hat{X}}_{[1]} \\ \vdots \\ \overset{b}{\hat{X}}_{[\frac{K}{2I}-1]} \\ \overset{b}{\hat{X}}_{[\frac{K}{2I}]} \\ \overset{rc}{P} \cdot \left(\overset{b}{\hat{X}}_{[\frac{K}{2I}-1]}\right)^* \\ \vdots \\ \overset{rc}{P} \cdot \left(\overset{b}{\hat{X}}_{[2]}\right)^* \\ \overset{rc}{P} \cdot \left(\overset{b}{\hat{X}}_{[1]}\right)^* \end{pmatrix} \quad (40)$$

$$\overset{b}{X} = \begin{pmatrix} \overset{b}{X}_{[0]} \\ \overset{b}{X}_{[1]} \\ \vdots \\ \overset{b}{X}_{[\frac{K}{2I}-1]} \\ \overset{b}{X}_{[\frac{K}{2I}]} \\ \overset{rc}{P} \cdot \left(\overset{b}{X}_{[\frac{K}{2I}-1]}\right)^* \\ \vdots \\ \overset{rc}{P} \cdot \left(\overset{b}{X}_{[2]}\right)^* \\ \overset{rc}{P} \cdot \left(\overset{b}{X}_{[1]}\right)^* \end{pmatrix} \quad (41)$$

Further advantages can be obtained by altering the internal structure of (23). Examining (23), the inventors have determined that the problem as discussed to this point is structured as parallel streams of data processed by interleaved digitizers for each frequency (as the problem seems physically). This can be seen by observing that $\mathrm{diag}_c(H)$ forms a diagonal block matrix where each block on the diagonal is the entire frequency response for a given digitizer. Yet another permutation matrix $\overset{r}{P}_{K,I}$ is introduced that is defined as a $K \cdot I \times K \cdot I$ element matrix that is zero everywhere except, for $k \in 0 \ldots K-1$, $i \in 0 \ldots I-1$:

$$\overset{r}{P}_{K,I_{[i+k \cdot I][k+i \cdot K]}} = 1 \quad (42)$$

This matrix is applied internally to (23), recognizing that $$\overset{r}{P}_{K,I}^T \cdot \overset{r}{P}_{K,I} = I_{K \cdot I}$$

and one obtains:

$$\overset{b}{\hat{H}} = \overset{b}{P}_{K,I} \cdot \mathcal{F}^{-1} \cdot \overset{a}{P}_{K,I} \cdot \overset{u}{P}_{K,I} \cdot \overset{d}{P}_{K,I} \cdot \left(I \otimes \mathcal{F}_K^{-1}\right) \cdot \overset{r}{P}_{K,I}^T \cdot \overset{r}{P}_{K,I} \cdot \mathrm{diag}_c(H) \cdot \overset{r}{P}_{K,I}^T \cdot \overset{r}{P}_{K,I} \cdot \overset{s}{P}_{K,I} \cdot \overset{b}{P}_{K,I}^T \quad (43)$$

This provides for a desired internal structure:

$$\overset{r}{P}_{K,I} \cdot \mathrm{diag}_c(H) \cdot \overset{r}{P}_{K,I}^T = \mathrm{diag}_c(H^T) \quad (44)$$

leading to a new form of (43):

$$\overset{b}{\hat{H}} = \overset{b}{P}_{K,I} \cdot \mathcal{F}^{-1} \cdot \overset{a}{P}_{K,I} \cdot \overset{u}{P}_{K,I} \cdot \overset{d}{P}_{K,I} \cdot \left(I \otimes \mathcal{F}_K^{-1}\right) \cdot \overset{r}{P}_{K,I}^T \cdot \mathrm{diag}_c(H^T) \cdot \overset{r}{P}_{K,I} \cdot \overset{s}{P}_{K,I} \cdot \overset{b}{P}_{K,I}^T = \quad (45)$$

$$\mathrm{diag}\begin{bmatrix} \begin{pmatrix} \overset{b}{\hat{H}}_{[0]} \\ \overset{b}{\hat{H}}_{[1]} \\ \vdots \\ \overset{b}{\hat{H}}_{[\frac{K}{2I}-1]} \\ \overset{b}{\hat{H}}_{[\frac{K}{2I}]} \\ \overset{b}{\hat{H}}_{[\frac{K}{2I}+1]} \\ \vdots \\ \overset{b}{\hat{H}}_{[\frac{K}{I}-2]} \\ \overset{b}{\hat{H}}_{[\frac{K}{I}-1]} \end{pmatrix} \end{bmatrix}$$

Recognize that now, $\mathrm{diag}_c(H^T)$ forms a block diagonal matrix where each block on the diagonal is the response of each digitizer to a particular frequency. The advantage of this restructuring can be seen by analyzing further the structure of $\overset{b}{\hat{H}}$ as provided in (45). The equation (45) is separated into three portions. For the right side of the equation:

$$R = \overset{r}{R}_{K,I} \cdot \overset{s}{R}_{K,I} \cdot \overset{b}{R}_{K,I}^T = \begin{pmatrix} \overset{b}{R}_{[0]} & 0 & \cdots & 0 \\ 0 & \overset{b}{R}_{[0]} & \cdots & 0 \\ \vdots & \vdots & \ddots & \vdots \\ 0 & 0 & 0 & \overset{b}{R}_{[0]} \\ \overset{b}{R}_{[1]} & 0 & \cdots & 0 \\ 0 & \overset{b}{R}_{[1]} & \cdots & 0 \\ \vdots & \vdots & \ddots & \vdots \\ 0 & 0 & 0 & \overset{b}{R}_{[1]} \\ \overset{b}{R}_{[I-1]} & 0 & \cdots & 0 \\ 0 & \overset{b}{R}_{[I-1]} & \cdots & 0 \\ \vdots & \vdots & \ddots & \vdots \\ 0 & 0 & 0 & \overset{b}{R}_{[I-1]} \end{pmatrix} \quad (46)$$

where each $\overset{b}{R}_{[i]}$ is an $I \times I$ matrix having all zeros except for ones in column i. $R$ is a block $K \times K/I$ which turns out to be $K \cdot I \times K$ in flattened form.

For the left side of (45), one has:

$$L = \overset{b}{\underset{K,I}{P}} \cdot \underset{K}{\mathcal{F}} \cdot \overset{a}{\underset{K,I}{P}} \cdot \overset{u}{\underset{K,I}{P}} \cdot \overset{d}{\underset{K,I}{P}} \cdot \left(I \otimes \underset{K}{\mathcal{F}^{-1}}\right) \cdot \overset{r}{\underset{K,I}{P}}^T = \qquad (47)$$

$$\begin{pmatrix} \overset{b}{L}_{[0]} & 0 & \ldots & 0 & \overset{b}{L}_{[1]} & 0 & \ldots & 0 & \ldots & \overset{b}{L}_{[I-1]} & 0 & \ldots & 0 \\ 0 & \overset{b}{L}_{[0]} & \ldots & 0 & 0 & \overset{b}{L}_{[1]} & \ldots & 0 & \ldots & 0 & \overset{b}{L}_{[I-1]} & \ldots & 0 \\ \vdots & \vdots & \ddots & \vdots & \vdots & \vdots & \ddots & \vdots & \ddots & \vdots & \vdots & \ddots & \vdots \\ 0 & 0 & 0 & \overset{b}{L}_{[0]} & 0 & 0 & 0 & \overset{b}{L}_{[1]} & \ldots & 0 & 0 & 0 & \overset{b}{L}_{[I-1]} \end{pmatrix}$$

where each $\overset{b}{L}_{[i]}$ is an I×I dense matrix containing various complex values with magnitude 1/I rotated through many angles. L is a block K/I×K which turns out to be K×K·I in flattened form. A way to calculate $\overset{b}{L}_{[i]}$ is:

$$\overset{b}{L}_{[i]} = \text{submatrix}\left[\overset{b}{\underset{K,I}{P}} \cdot \underset{K}{\mathcal{F}} \cdot \overset{a}{\underset{K,I}{P}} \cdot \overset{u}{\underset{K,I}{P}} \cdot \overset{d}{\underset{K,I}{P}} \cdot \left(I \otimes \underset{K}{\mathcal{F}^{-1}}\right) \cdot \overset{r}{\underset{K,I}{P}}^T, 0, I-1, \qquad (48)$$

$$i \cdot K, i \cdot K + I - 1\right]$$

One can write $\text{diag}_c(H^T)$ in (45) as a block K×K diagonal matrix which is a K·I×K·I diagonal matrix in flattened form. It can be written with a structure:

$$\text{diag}_c(H^T) = \text{diag}\begin{bmatrix} \text{diag}(H^T_{[*][0]}) \\ \text{diag}(H^T_{[*][1]}) \\ \vdots \\ \text{diag}\left(H^T_{[*][\frac{K}{2\cdot I}-1]}\right) \\ \text{diag}\left(H^T_{[*][\frac{K}{2\cdot I}]}\right) \\ \overset{rc}{P}_I \cdot \text{diag}\left(H^T_{[*][\frac{K}{2\cdot I}-1]}\right)^* \cdot \overset{rcT}{P}_I \\ \vdots \\ \overset{rc}{P}_I \cdot \text{diag}(H^T_{[*][2]})^* \cdot \overset{rcT}{P}_I \\ \overset{rc}{P}_I \cdot \text{diag}(H^T_{[*][1]})^* \cdot \overset{rcT}{P}_I \end{bmatrix} \qquad (49)$$

where it is clear that $(H_{[*][k]}^T)$ is simply row k of H in a column vector, or the response of each interleaved digitizer to a tone at frequency k in a column vector where each row of the column vector corresponds to a given digitizer.

Expanding $L \cdot \text{diag}_c(H^T) \cdot R$, one obtains:

$$\hat{H} = L \cdot \text{diag}_c(H^T) \cdot R = \text{diag}\begin{bmatrix} \hat{H}_{[0]} \\ \hat{H}_{[1]} \\ \vdots \\ \hat{H}_{[\frac{K}{2\cdot I}-1]} \\ \hat{H}_{[\frac{K}{2\cdot I}]} \\ \overset{rc}{P}_I \cdot (\hat{H}_{[\frac{K}{2\cdot I}-1]})^* \cdot \overset{rcT}{P}_I \\ \vdots \\ \overset{rc}{P}_I \cdot (\hat{H}_{[2]})^* \cdot \overset{rcT}{P}_I \\ \overset{rc}{P}_I \cdot (\hat{H}_{[1]})^* \cdot \overset{rcT}{P}_I \end{bmatrix} = \qquad (50)$$

$$\text{diag}\begin{bmatrix} \sum_{i=0}^{I-1}\left\{\overset{b}{L}_{[i]} \cdot \text{diag}\left(H^T_{[*][i\cdot\frac{K}{I}]}\right) \cdot \overset{b}{R}_{[i]}\right\} \\ \sum_{i=0}^{I-1}\left\{\overset{b}{L}_{[i]} \cdot \text{diag}\left(H^T_{[*][i\cdot\frac{K}{I}+1]}\right) \cdot \overset{b}{R}_{[i]}\right\} \\ \vdots \\ \sum_{i=0}^{I-1}\left\{\overset{b}{L}_{[i]} \cdot \text{diag}\left(H^T_{[*][i\cdot\frac{K}{I}+\frac{K}{2\cdot I}-1]}\right) \cdot \overset{b}{R}_{[i]}\right\} \\ \sum_{i=0}^{I-1}\left\{\overset{b}{L}_{[i]} \cdot \text{diag}\left(H^T_{[*][i\cdot\frac{K}{I}+\frac{K}{2\cdot I}]}\right) \cdot \overset{b}{R}_{[i]}\right\} \\ \overset{rc}{P}_I \cdot \left(\sum_{i=0}^{I-1}\left\{\overset{b}{L}_{[i]} \cdot \text{diag}\left(H^T_{[*][i\cdot\frac{K}{I}+\frac{K}{2\cdot I}-1]}\right) \cdot \overset{b}{R}_{[i]}\right\}\right)^* \cdot \overset{rcT}{P}_I \\ \vdots \\ \overset{rc}{P}_I \cdot \left(\sum_{i=0}^{I-1}\left\{\overset{b}{L}_{[i]} \cdot \text{diag}(H^T_{[*][2]}) \cdot \overset{b}{R}_{[i]}\right\}\right)^* \cdot \overset{rcT}{P}_I \\ \overset{rc}{P}_I \cdot \left(\sum_{i=0}^{I-1}\left\{\overset{b}{L}_{[i]} \cdot \text{diag}(H^T_{[*][1]}) \cdot \overset{b}{R}_{[i]}\right\}\right)^* \cdot \overset{rcT}{P}_I \end{bmatrix}$$

But one finds that each element of the sum:

$$\overset{b}{L}_{[i]} \cdot \text{diag}\left(H^T_{[*][i\cdot\frac{K}{I}+b]}\right) \cdot \overset{b}{R}_{[i]}$$

is simply a matrix of all zeros except for column i which is column i of $\overset{b}{\mathring{H}}_{[b]}$.

$$\overset{b}{L}_{[i]} \cdot (H^T)_{[*][i \cdot \frac{K}{I} + b]} = \left(\overset{b}{\mathring{H}}_{[b]}\right)_{[*][i]} \tag{51}$$

Therefore, one can recompute the rows of H from the columns of each of the $\overset{b}{\mathring{H}}_{[b]}$ as:

$$(H^T)_{[*][i \cdot \frac{K}{I} + b]} = \left(\overset{b}{L}_{[i]}\right)^{-1} \cdot \left(\overset{b}{\mathring{H}}_{[b]}\right)_{[*][i]} \tag{52}$$

or:

$$\left(H_{[i \cdot \frac{K}{I} + b][*]}\right)^T = \left(\overset{b}{L}_{[i]}\right)^{-1} \cdot \left(\overset{b}{\mathring{H}}_{[b]}\right)_{[*][i]} \tag{53}$$

or:

$$\left(H_{[i \cdot \frac{K}{I} + b][*]}\right)^T = \left(\left(\overset{b}{L}_{[i]}\right)^{-1} \cdot \overset{b}{\mathring{H}}_{[b]}\right)_{[*][i]} \tag{54}$$

or for r∈0 . . . I−1:

$$H_{[i \cdot \frac{K}{I} + b][r]} = \left\{\left(\overset{b}{L}_{[i]}\right)^{-1} \cdot \overset{b}{\mathring{H}}_{[b]}\right\}_{[r][i]} \tag{55}$$

This means that every column of a block matrix $\overset{b}{\mathring{H}}_{[b]}$ corresponds to a row of H. In half DFT form, there are N+1=K/2+1 rows in H corresponding to positive frequencies and there are K/(2·I)+1 I×I block matrices in $\overset{b}{\mathring{H}}$ corresponding to positive frequencies leading to K/2+I total columns of all of the block matrices in $\overset{b}{\mathring{H}}$ corresponding to positive frequencies. This means that there are I−1 extra columns in the block matrices in $\overset{b}{\mathring{H}}$ containing redundant information.

Examining (48), it becomes apparent that for very modest sizes of K and I, the calculation of L is computationally intensive requiring large amounts of computing power and memory. Fortunately, the inventors have determined that the following simple expression can be utilized, for i, r, c∈0 . . . I−1:

$$\left(\overset{b}{L}_{[i]}\right)_{[r][c]} = e^{-j \cdot 2\pi \cdot \frac{1}{I} \cdot [c \cdot (r-i)]} \tag{56}$$

and that $$\left(\overset{b}{L}_{[i]}\right)^{-1} = \left(\overset{b}{L}_{[i]}\right)^H,$$

or:

$$\left\{\left(\overset{b}{L}_{[i]}\right)^{-1}\right\}_{[r][c]} = e^{j \cdot 2\pi \cdot \frac{1}{I} \cdot [r \cdot (c-i)]} \tag{57}$$

It is generally preferable to determine interleave corrections through the application of single tones, either in a calibration signal or through user supplied signals. Using single tones, in conjunction with the previous teaching, another embodiment is put forth.

Given an input tone at a single frequency, one finds that the tone is present at one or two frequency bins in the K element DFT X. For a preferably even K, one finds that for a positive frequency bin n∈0 . . . N where N=K/2 for the tone, the tone is present once at bin 0 or N if n=0 or n=N, and is present twice, once at bin n and at bin N+(N−n) otherwise in the full K element DFT. Note that even K is only stated as preferable, because all of the detailed calculations are provided here for even K. One could have equally provided the same analysis for odd K.

One finds that for a given bin n, that the block that the tone appears in is given by:

$$b_{[n]} = \text{mod}(n, I) \tag{58}$$

and the index of the tone within the block is given by:

$$t_{[n]} = \text{floor}\left(\frac{n}{I}\right) \tag{59}$$

so one can define p as:

$$p_{[n]} = t_{[n]} + \frac{K}{I} \cdot b_{[n]} \tag{60}$$

p is partitioned into I element blocks such that, for b∈0 . . . K/(2·I), i∈0 . . . I−1:

$$f_{[b]} = \text{submatrix}(p, b \cdot I, b \cdot I + I - 1, 0, 0) \tag{61}$$

or:

$$(f_{[b]})_{[i]} = \tag{62}$$
$$p_{[b \cdot I + i]} = t_{[b \cdot I + i]} + \frac{K}{I} \cdot b_{[b \cdot I + i]} = \text{floor}\left(\frac{b \cdot I + i}{I}\right) + \frac{K}{I} \cdot \text{mod}(b \cdot I + i, I)$$

Thus, for a given block b and corresponding matrix $\overset{b}{X}_{[b]}$ the tones present are tones listed in $f_{[b]}$. In other words, $$\left(\overset{b}{X}_{[b]}\right)_{[i]} = X_{[(f_{[b]})_{[i]}]}.$$

Similarly $$\left(\overset{b}{X}_{[b_{[n]}]}\right)_{[t_{[n]}]} = X_{[p_{[n]}]}.$$

It should be noted that the largest possible block number, for K a multiple of I is floor ((K−1)/I)=K/I−1, but only the possible block numbers b as extending to K/(2·I) have been defined, which is roughly half the total block numbers possible. To understand this, the inventors have examined the content of f as defined and found that the blocks defined for the range of b provided contain the effect of all of the possible positive frequencies; the effect because some of the frequency bins appearing in f are negative frequency bins and it is well known that for real input signals, certain positive frequency bins are accompanied by negative frequency bins as well. To rectify this, another array of vectors is defined based on f containing the positive tone frequencies as, for $b \in 0 \ldots K/(2 \cdot I)$, $i \in 0 \ldots I-1$:

$$(r_{[b]})_{[i]} = \begin{cases} (f_{[b]})_{[i]} & (f_{[b]})_{[i]} \leq N \\ N - ((f_{[b]})_{[i]} - N) & (f_{[b]})_{[i]} > N \end{cases} \quad (63)$$

Now, one finds that examining r that all positive frequency bins $n \in 0 \ldots N$ are present at least once in r as it's defined.

Another array of vectors is defined, again based on f that keeps track of whether the positive frequency was actually present as a negative frequency and therefore requiring the conjugate as:

$$(c_{[b]})_{[i]} = \begin{cases} 1 & (f_{[b]})_{[i]} \leq N \\ -1 & (f_{[b]})_{[i]} > N \end{cases} \quad (64)$$

Thus $$(\overset{b}{X}_{[b]})_{[i]} = \text{Re}(X_{[r_{[i]}]}) + j \cdot c_{[i]} \cdot \text{Im}(X_{[r_{[i]}]})$$

where $r_{[i]} \leq N$. In other words, all of the block matrices $\overset{b}{X}_{[b]}$ for $b \in 0 \ldots K/(2 \cdot I)$ contain tones that can be found (possibly conjugated) in the DFT vector X in bins between 0 and N inclusive.

Now that these array of vectors determining tone frequency bins and conjugation has been calculated for all of the blocks to be used, the same determinations for each frequency bin are made. For each bin $n \in 0 \ldots N$, one finds the block number b containing the bin n in r. $\mathcal{B}_{[n]} = b$ is assigned. Therefore, for $b \in 0 \ldots (2 \cdot I)$, $i \in 0 \ldots I-1$:

$$\mathcal{B}\left[(r_b)_{[i]}\right] = b \quad (65)$$

Then, $\mathcal{R}_{[n]} = r_{[\mathcal{B}_{[n]}]}$ and $\mathcal{C}_{[n]} = c_{[\mathcal{B}_{[n]}]}$ are assigned. For each of the $i \in 0 \ldots I-1$ index numbers:

$$(\mathcal{T}_{[n]})_{[i]} = \begin{cases} 0 & (\mathcal{R}_{[n]})_{[i]} \neq n \\ (C_{[n]})_{[i]} & (\mathcal{R}_{[n]})_{[i]} = n \end{cases} \quad (66)$$

In this way, for each possible positive frequency bin $n \in 0 \ldots N$, one has the block for the bin in $\mathcal{B}_{[n]}$, the list of all frequency bins present in the block in $\mathcal{R}_{[n]}$, whether the frequency is present as the conjugate in $\mathcal{C}_{[n]}$ and all of the locations where frequency n occurs in the block in $\mathcal{T}_{[n]}$ where for a given index in the block $(\mathcal{T}_{[n]})_{[i]}$, there is a one where frequency bin n appears as a positive frequency, a negative one where it appears as a negative frequency, and a zero where it does not appear.

In most cases, $\mathcal{T}_{[n]}$ is a vector containing all zeros except for a single 1, although occasionally, it contains all zeros and a single −1, and in some cases, it contains both a 1 and a −1.

A preferable strategy for interleave correction involves refining the calculation of H by acquiring a single tone at a time. For any input waveform X one can determine if it is an applicable signal for calibration by examining it for all zeros except for a single bin t such that $H_{[t]} \neq 0$. For this bin t, one finds the block b for this tone in $\mathcal{B}_{[n]}$.

Then, one can build the block vector for the input tone as, for $i \in 0 \ldots I-1$:

$$(\overset{b}{X}_{[b]})_{[i]} = \begin{cases} \text{Re}(X_{[(\mathcal{R}_{[t]})_{[i]}]}) + j \cdot (\mathcal{T}_{[t]})_{[i]} \cdot \text{Im}(X_{[(\mathcal{R}_{[t]})_{[i]}]}) & (\mathcal{T}_{[t]})_{[i]} \neq 0 \\ 0 & (\mathcal{T}_{[t]})_{[i]} = 0 \end{cases} \quad (67)$$

Then, one can build the block vector for the acquired tones as, for $i \in 0 \ldots I-1$:

$$(\hat{\overset{b}{X}}_{[b]})_{[i]} = \text{Re}(X_{[(\mathcal{R}_{[t]})_{[i]}]}) + j \cdot (C_{[t]})_{[i]} \cdot \text{Im}(\hat{X}_{[(\mathcal{R}_{[t]})_{[i]}]}) \quad (68)$$

Only the rows in $\overset{b}{X}_{[b]}$ are kept pertaining to nonzero elements in $\mathcal{T}_{[t]}$ recognizing that the rows in $\overset{b}{X}_{[b]}$ corresponding to zero elements in $\mathcal{T}_{[t]}$ are always zero and $\overset{b}{X}'_{[b]}$ is formed which has the zero rows removed. $\overset{b}{X}'_{[b]}$ and $\hat{\overset{b}{X}}_{[b]}$ are then augmented with previously held block matrices $\overset{b}{X}'_{[b]}$ and $\hat{\overset{b}{X}}_{[b]}$ to form a new ensemble of measurements. $\overset{b}{X}'_{[b]}$ is referred to as a block dominant tone segment and $\overset{b}{X}'_{[b]}$ as an accumulated block dominant tone segment where each of these terms applies generally to a reduction in terms of a corresponding frequency-domain ideal block segment and accumulated frequency-domain known block segment structure.

Then:

$$\overset{b}{H}'_{[b]} = \hat{\overset{b}{X}}_{[b]} \cdot (\overset{b}{X}'_{[b]})^\dagger \quad (69)$$

The inventors refer to $\overset{b}{H}'_{[b]}$ as a block impairment transfer column vector.

If this newly calculated $\overset{b}{H}'_{[b]}$ exists, then this skinny matrix contains columns of $\overset{b}{H}_{[b]}$ corresponding to the nonzero entries in $\mathcal{T}_{[n]}$.

In other words, if a vector $\mathcal{T}'$ is formed containing the indices of the nonzero elements of $\mathcal{T}_{[t]}$, whose length is $C$, then for every $c \in 0 \ldots C-1$, one can update the columns of one of the block impairment transfer matrices as, for each row $i \in 0 \ldots I-1$:

$$(\overset{b}{H}_{[b]})_{[i][\mathcal{T}'_{[c]}]} = (\overset{b}{H}'_{[b]})_{[i][c]}$$

Thus, $\overset{b}{H}'_{[b]}$ contains replacement columns that can be used to form a new $\overset{b}{H}_{[b]}$ H, $\overset{b}{\mathbb{H}}$, andor $\mathbb{H}$ and their inverses. The inventors have determined that this calculation can produce a single row of H. Since $\overset{b}{\hat{H}}'_{[b]}$ is skinny containing columns corresponding to nonzero elements in $\mathcal{T}_{[t]}$. Thus the term block impairment transfer column vector is used generally to refer to any structure containing information capable of generating a single row of a digitizer frequency response matrix, which in turn refers generally to the frequency response of each digitizer in a system of interleaved digitizers at a single frequency.

One may preferably find the index a corresponding to the index of the first nonzero element in $\mathcal{T}_{[t]}$ and compute:

$$H_{[t][*]} = \operatorname{Re}\left(\left\{\left(\overset{b}{L}_{[\sigma]}\right)^{-1} \cdot \overset{b}{H}'_{[b]}\right\}^T_{[0][*]}\right) + j \cdot (C_{[t]})_{[\sigma]} \cdot \operatorname{Im}\left(\left\{\left(\overset{b}{L}_{[\sigma]}\right)^{-1} \cdot \overset{b}{H}'_{[b]}\right\}^T_{[0][*]}\right) \quad (70)$$

or, for i∈0 ... I−1:

$$H_{[t][i]} = \operatorname{Re}\left(\left\{\left(\overset{b}{L}_{[\sigma]}\right)^{-1} \cdot \overset{b}{H}'_{[b]}\right\}^T_{[0][i]}\right) + j \cdot (C_{[t]})_{[\sigma]} \cdot \operatorname{Im}\left(\left\{\left(\overset{b}{L}_{[\sigma]}\right)^{-1} \cdot \overset{b}{H}'_{[b]}\right\}^T_{[0][i]}\right) \quad (71)$$

Thus, to reiterate, a concise method exists for refining a measurement of H, and more specifically a single row of H from the application of a single tone. This method as described involves determining the tone bin t in the DFT X, forming $\overset{b}{\hat{X}}'_{[b]}$ and $\overset{b}{\hat{X}}_{[b]}$ from the known, applied tone and the observation or acquired tones, forming $\overset{b}{\hat{X}}'_{[b]}$ and $\overset{b}{\hat{X}}_{[b]}$ by combining these newly known, applied tones and the newly observed tones along with previous known and observed sets of tones, determining $\overset{b}{\hat{H}}'_{[b]}$ from these matrices and finally determining a new $H_{[t][*]}$, which is a new row of H.

With the information disclosed, it is clear how one would obtain equivalently a new estimate for $\overset{b}{\hat{H}}_{[b]}$, $\overset{b}{H}$, H and/or $\mathbb{H}$ and their inverses, which in turn is capable of modeling the impairment due to interleave mismatch or correcting for said impairment.

A next refinement on the algorithm involves the determination of X and thus $\overset{b}{X}'_{[b]}$. Generally speaking, it is often difficult to ascertain the exact value of X, especially with regard to phase. In other words, with the application of an actual single tone to the system X, one is able to directly observe $\hat{X}$ but might not know exactly the value of X. One way to deal with this is to assume that dominant tones in $\hat{X}$ are a good estimation of the actual tone applied in X and that very small tones in $\hat{X}$ are entirely caused by interleave error (i.e. ought to be zero in X). Thus, one could determine a reasonable estimation of X directly from the observation $\hat{X}$. To do this, one may preferably set some thresholds that determine whether a tone is dominant (i.e. truly present) or if it is assumed to be caused by interleave error. One way to do this is to use, for example, one-quarter of the full-scale signal as the threshold for a dominant tone and require all other tones to be below one-tenth of the size of the dominant tone to be assumed as an interleave artifact. These thresholds can be applied individually to blocks and multiple or all blocks can be calibrated simultaneously. To do this, one would preferably have, for b∈0 ... K/(2·I), for each b, tones in $\hat{x}$ such that, for i∈0 ... I−1, a single tone bin $t = (r_{[b]})_{[i]}$ such that $\hat{X}[t]$ contained a dominant tone and all other bins in $r_{[b]}$ were bins in $\hat{X}$ containing values assumed to be interleave artifacts. Alternatively, one could determine suitable measurements on a tone bin basis. This could be done by, for n∈0 ... N−1 checking each n for suitability. This is done for each n by first determining the block number $b = \mathcal{B}_{[n]}$ and forming $\hat{X}_{[b]}$ according to (68). Then, for i∈0 ... I−1, one may check that $|(\hat{X}_{[b]})_{[i]}|$ is greater than the dominant tone threshold for any i where $(\mathcal{T}_{[n]})_{[i]} \neq 0$ and that $|(\hat{X}_{[b]})_{[i]}|$ is less than the interleave artifact tone threshold for any i where $(\mathcal{T}_{[n]})_{[i]} = 0$. For all values of t=n that meets the criteria, one can form $X_{[b]}$ by, for i∈0 ... I−1:

$$\left(\overset{b}{X}_{[b]}\right)_{[i]} = \begin{cases} (\hat{X}_{[b]})_{[i]} & (\mathcal{T}_{[n]})_{[i]} \neq 0 \\ 0 & (\mathcal{T}_{[n]})_{[i]} = 0 \end{cases} \quad (72)$$

There can be many n that meet the criteria, but in general, each n that meets the criteria will be associated with different blocks b.

The validity of the assumption that (72) is a good estimate of the true $\overset{b}{X}_{[b]}$ hinges on how bad the interleave error is in the first place. If the interleave error is very small, it can be shown that (72) is a very good approximation. The effect of the goodness of the approximation, fortunately, is only a minor error in the value of the dominant tone recovered and does not impede the ability of the algorithm to null the interleave artifacts. That being said, a preferable arrangement is to perform a factory calibration of H during production of the digitizing system and to perform corrections using the factory calibration prior to observing $\hat{X}$. In other words, $\hat{X}$ contains observations of waveforms with interleave corrections performed that make the residual interleave error very small. In this manner, the refinement of H performed by the present method can rely on the fact that the interleave error is small. Furthermore, this leads to possibilities of using the user's input signal to perform the corrections. In other words, as user signals are applied to the system, the present method can analyze this user input signal for suitability for correction in the manner prescribed previously. When suitable signals are acquired, the method can perform refinements on H. Since one can assume that the interleave error should be small, one might place bounds on H that each value $H_{[n][i]}$ be such that $|H_{[n][i]}| < \epsilon$ for some predetermined value of $\epsilon$. In this manner, a sanity check can be performed that prevents catastrophic failure of the method and prevents being fooled by pathological input signals. Checks can be made on each element of H, each row of H or on the entirety of H and various adjustments can be made to the new H.

Note that if a factory calibrated H is applied to the acquired waveform, then the on-the-fly algorithm described thus far will calculate an appropriate column of $\overset{b}{\hat{H}}_{[b]}$. This does not correspond to the true $\overset{b}{\hat{H}}_{[b]}$, but the additional correction needed when the factory calibration is applied. In order to obtain the true $\overset{b}{\hat{H}}_{[b]}$, one must update the factory $\overset{b}{\hat{H}}_{[b]}$ by the on-the-fly corrected $\overset{b}{\hat{H}}_{[b]}$. If $\overset{b}{\hat{H}}_{[b]\,updated}$ denotes the updated $\overset{b}{\hat{H}}_{[b]}$, $\overset{b}{\hat{H}}_{[b]\,factory}$ denotes the $\overset{b}{\hat{H}}_{[b]}$ corresponding to factory calibration and $\overset{b}{\hat{H}}_{[b]\,OnTheFly}$ denotes the $\overset{b}{\hat{H}}_{[b]}$ corresponding to on-the-fly calibration, then $$\overset{b}{\mathrm{H}}_{[b]\ updated} = \overset{b}{\mathrm{H}}_{[b]\ factory} \cdot \overset{b}{\mathrm{H}}_{[b]\ OnTheFly} \quad (73)$$

It has been mentioned earlier that, in most cases, $\mathcal{T}_{[n]}$ is a vector containing all zeros except for a single 1. Here, that case is now considered. Under this circumstance, $\overset{b}{\mathrm{X}}_{[b]}$ is a vector containing a single nonzero element. Therefore, in this case, for M measurements for a given block b, $\overset{b}{\mathrm{X}}'_{[b]}$ is a M element row vector and $\overset{b}{\mathrm{H}}'_{[b]}$ is a I column vector. $\overset{b}{\mathrm{X}}_{[b]}$ is an I element column vector. $\overset{b}{\mathcal{X}}_{[b]}$ is an I×M element matrix. Therefore, (69) takes on the following form:

$$\begin{pmatrix} (\overset{b}{\mathrm{H}}'_{[b]})_{[0]} \\ (\overset{b}{\mathrm{H}}'_{[b]})_{[1]} \\ \vdots \\ (\overset{b}{\mathrm{H}}'_{[b]})_{[I-1]} \end{pmatrix} = \ldots \quad (74)$$

$$\ldots = \begin{pmatrix} (\overset{b}{\mathcal{X}}_{[b]})_{[0][0]} & (\overset{b}{\mathcal{X}}_{[b]})_{[0][1]} & \cdots & (\overset{b}{\mathcal{X}}_{[b]})_{[0][M-1]} \\ (\overset{b}{\mathcal{X}}_{[b]})_{[1][0]} & (\overset{b}{\mathcal{X}}_{[b]})_{[1][1]} & \cdots & (\overset{b}{\mathcal{X}}_{[b]})_{[1][M-1]} \\ \vdots & \vdots & \ddots & \vdots \\ (\overset{b}{\mathcal{X}}_{[b]})_{[I-1][0]} & (\overset{b}{\mathcal{X}}_{[b]})_{[I-1][1]} & \cdots & (\overset{b}{\mathcal{X}}_{[b]})_{[I-1][M-1]} \end{pmatrix}$$

$$\left( (\overset{b}{\mathrm{X}}'_{[b]})_{[0]} (\overset{b}{\mathrm{X}}'_{[b]})_{[1]} \cdots (\overset{b}{\mathrm{X}}'_{[b]})_{[M-1]} \right)^\dagger$$

Which leads to the solution:

$$\begin{pmatrix} (\overset{b}{\mathrm{H}}'_{[b]})_{[0]} \\ (\overset{b}{\mathrm{H}}'_{[b]})_{[1]} \\ \vdots \\ (\overset{b}{\mathrm{H}}'_{[b]})_{[I-1]} \end{pmatrix} = \frac{1}{\sum_{m=0}^{M-1} |(\overset{b}{\mathrm{X}}'_{[b]})_{[0][m]}|^2} \cdot \begin{pmatrix} \sum_{m=0}^{M-1} \{(\overset{b}{\mathcal{X}}_{[b]})_{[0][m]} \cdot (\overset{b}{\mathrm{X}}'_{[b]})_{[0][m]}^*\} \\ \sum_{m=0}^{M-1} \{(\overset{b}{\mathcal{X}}_{[b]})_{[1][m]} \cdot (\overset{b}{\mathrm{X}}'_{[b]})_{[0][m]}^*\} \\ \vdots \\ \sum_{m=0}^{M-1} \{(\overset{b}{\mathcal{X}}_{[b]})_{[I-1][m]} \cdot (\overset{b}{\mathrm{X}}'_{[b]})_{[0][m]}^*\} \end{pmatrix} \quad (75)$$

Thus, given previous values of $\overset{b}{\mathrm{X}}'_{[b]}$ and $\overset{b}{\mathcal{X}}_{[b]}$ and a new column vector $\overset{b}{\hat{\mathrm{X}}}_{[b]}$ and a new single element vector $\overset{b}{\hat{\mathrm{X}}}'_{[b]}$, one can compute the recursive least-squares solutions as:

$$(\overset{b}{\mathrm{H}}'_{[b]})_{[i]} = \frac{\sum_{m=0}^{M-1} \{(\overset{b}{\mathcal{X}}_{[b]})_{[i][m]} \cdot (\overset{b}{\mathrm{X}}'_{[b]})_{[0][m]}^*\} + (\overset{b}{\hat{\mathrm{X}}}_{[b]})_{[i]} \cdot (\overset{b}{\hat{\mathrm{X}}}'_{[b]})_{[0]}^*}{\sum_{m=0}^{M-1} |(\overset{b}{\mathrm{X}}'_{[b]})_{[0][m]}|^2 + |(\overset{b}{\hat{\mathrm{X}}}'_{[b]})_{[0]}|^2} \quad (76)$$

In other words, it is possible to keep two sets of accumulators, $A_{N[i]}$ and $A_D$, each initialized to zero and as each new measurement $\overset{b}{\hat{\mathrm{X}}}_{[b]}$ and $\overset{b}{\hat{\mathrm{X}}}'_{[b]}$ are obtained, the accumulators are preferably updated as:

$$A_{N[i]} \leftarrow A_{N[i]} + (\overset{b}{\hat{\mathrm{X}}}_{[b]})_{[i]} \cdot (\overset{b}{\hat{\mathrm{X}}}'_{[b]})_{[0]}^* \quad (77)$$

and:

$$A_D \leftarrow A_D + |(\overset{b}{\hat{\mathrm{X}}}'_{[b]})_{[0]}|^2 \quad (78)$$

and update $\overset{b}{\mathrm{H}}'_{[b]}$ as:

$$(\overset{b}{\hat{\mathrm{H}}}'_{[b]})_{[i]} \leftarrow \frac{A_{N[i]}}{A_D} \quad (79)$$

This is a recursive least-squares solution that utilizes all measurements made. Some options are to periodically reset $A_{N[i]}$ and $A_D$ to zero, or to hold off up-dates of $\overset{b\ '}{\mathrm{H}}_{[b]}$ until enough measurements have been accumulated in the accumulators.

Alternatively, one could keep two vectors which consist of delayed values of, or a pipeline of, two accumulators, initialized to zero, for M measurements, for m∈0 ... M−1 of $D_{N[i][m]}$ and $D_{D[m]}$ where, for each update, one first advances the pipeline, for i∈0 ... I−1:

$$D_{N[i][m]} \leftarrow \begin{cases} D_{N[i][m-1]} & m > 0 \\ 0 & m = 0 \end{cases} \quad (80)$$

and:

$$D_{D[m]} = \begin{cases} D_{D[m-1]} & m > 0 \\ 0 & m = 0 \end{cases} \quad (81)$$

and then the new measurements are installed:

$$D_{N[i][0]} \leftarrow (\overset{b}{\hat{\mathrm{X}}}_{[b]})_{[i]} \cdot (\overset{b}{\hat{\mathrm{X}}}'_{[b]})_{[0]}^* \quad (82)$$

and:

$$D_{D[0]} = |(\overset{b}{\hat{\mathrm{X}}}'_{[b]})_{[0]}|^2 \quad (83)$$

and update $\overset{b}{\mathrm{H}}'_{[b]}$ as:

$$(\overset{b}{\hat{\mathrm{H}}}'_{[b]})_{[i]} \leftarrow \frac{\sum_{m=0}^{M-1} D_{N[i][m]}}{\sum_{m=0}^{M-1} D_{D[m]}} \quad (84)$$

Alternatively, one can weight each of the $D_N$ and $D_D$ values based on recentness of measurements or other criteria.

Some other alternatives exist that are not exactly the same as a least-squares solution, but are nearly as effective and simpler to implement. Examine once again the structure of (69). For the common case, again, of $\mathcal{T}_{[t]}$ being a vector containing all zeros except for a single 1 or −1 for a given tone bin t, again one has $\overset{b}{X}_{[b]}$ as a vector containing a single nonzero element and $\overset{b}{\hat{X}}_{[b]}$ being an I element column vector. Therefore, in this case, for M=1 measurements for a given block b, $\overset{b}{X}'_{[b]}$ is a complex scalar and $\overset{b}{\mathbb{H}}'_{[b]}$ is a I×1 element column vector. Under this circumstance, one can compute:

$$\overset{b}{\mathbb{H}}'_{[b]} = \frac{\overset{b}{\hat{X}}_{[b]}}{\overset{b}{X}'_{[b]}} = \frac{\overset{b}{\hat{X}}_{[b]}}{\overset{b}{X}_{[b]}} \quad (85)$$

Thus, in this circumstance, one measurement was made and from it, $\overset{b}{\mathbb{H}}'_{[b]}$ was obtained, which is a single column of $\overset{b}{\mathbb{H}}_{[b]}$ and from which can be calculated a single row of H. One can make multiple measurements of $\overset{b}{\mathbb{H}}'_{[b]}$ and average them or perform some other smoothing or filtering with these multiple measurements or one can convert each $\overset{b}{\mathbb{H}}'_{[b]}$ to a single row of H and smooth those values through averaging or filtering. In the circumstance where $\mathcal{T}_{[t]}$ is a vector containing multiple nonzero values, then multiple tones are required to obtain a single $\overset{b}{\mathbb{H}}'_{[b]}$ corresponding to a single row of H. We can use recursive least-squares estimation algorithm to obtain the unknown columns in this case. The algorithm is referred to as Sequential Least Squares problem in the book *Fundamentals of Statistical Signal Processing, Volume 1: Estimation Theory* by Steven M. Kay.

In FIG. 6, a Python program listing shows an embodiment of the invention. Information on the Python programming language can be found at www.python.org. The line numbers for the program listing are shown to the left. On line 1 the class defined in FIG. 8 is imported and on line 2, the class defined in FIG. 7 is imported. Line 3 imports a Matrix class whose operations and functions are deemed obvious to one skilled in the art, especially in light of the previous discussion where all important matrix operations have been defined mathematically. Line 4 is empty. On line 5, one sees the class name OnTheFlyInterleaveCorrection and on lines 6, 13, and 34 one sees three member functions: _init_, WhichMeasurementTones, and NewMeasurement. The _init_ function is the constructor and takes two arguments K and I. As such, when a new instance of the class OnTheFlyInterleaveCorrection is instantiated, one preferably provides the length of the buffer in K that would contain time-domain signals that would in turn be used to create the DFT of the signal and provided to the object on each new measurement and the number of interleaved digitizers in I. This is all of the information required to initialize the object. On line 7, one sees the member object m_ilv created as an instance of the class InterleaveInfo with K and I provided; this class is shown in FIG. 7 and will be discussed subsequently. On line 8 one sees the member object m_Hb which is an array of K/(2·I) I×I matrices corresponding to the non-redundant elements on the diagonal of $\overset{b}{\mathbb{H}}$ provided in (39). As such m_Hb is a member object containing block impairment transfer matrices. Note that for b∈0 . . . K/(2·I), each $\overset{b}{\mathbb{H}}_{[b]}$ is initialized to $\frac{I}{I}$ to indicate no correction initially. On line 9, one sees the member matrix list m_Xprime which corresponds to a list of, for each n∈0 . . . N, an $\overset{b}{X}'_{[b]}$ which is a accumulated block dominant tone segment where each $\overset{b}{X}'_{[b]}$ corresponds to specific elements of either $\overset{b}{\hat{X}}_{[b]}$, which is an accumulated frequency-domain block acquisition segment, or $\overset{b}{X}_{[b]}$, which is an accumulated frequency-domain known block segment, as previously outlined and to be discussed subsequently where the subscript b corresponds to the block number corresponding to a dominant tone present as bin n according to $\mathcal{B}_{[n]}$ as provided in (65). Member m_Xprime is initialized to an empty matrix for each possible positive frequency indicating no measurements. On line 10 one sees the initialization of the member m_Xhat which corresponds to a list of, for each n∈0 . . . N, an $\overset{b}{\hat{X}}_{[b]}$ b=$\mathcal{B}_{[n]}$ where a dominant tone is present in bin n. Member m_Xhat is initialized to an empty matrix for each possible positive frequency indicating no measurements.

On line 11, the initialization of the member m_Li is shown, which is a list of, for each interleaved digitizer i∈0 . . . I−1 of pre-inverted matrices $\overset{b}{L}_{[i]}$ according to (57). These are optional because they are only required if it is needed to convert a subsequently calculated $\overset{b}{\mathbb{H}}$ back to H. This is sometimes not necessary depending on the nature of the correction employed. m_Li is initialized according to the function LiCalc which will be described subsequently.

On line 12, the initialization of m_H is shown to a (N+1)×I element matrix of all ones indicating an initially perfectly matched set of digitizers. As such, m_H represents H which further represents a digitizer frequency response matrix.

It is important to note that at the end of execution of the _init_ function, which again is the constructor for the class OnTheFlyInterleaveCorrection, much information has been pre-calculated and held in memory to perform the interleave correction with subsequently measured waveforms. The _init_ function and other initialization functions as provided by the classes and functions InterleaveInfo and LiCalc are shown here for completeness in practicing the invention but could just as easily be calculated offline or at design time and supplied to the function or hard coded for a particular predetermined K and I.

On line 13, one sees the function definition WhichMeasurementTones which takes as arguments a reference to the class instance (self) along with a vector x containing presumably an N elements as the DFT of a time-domain waveform either acquired or known which is indicative of a known waveform applied to the system. Also supplied is a preferably absolute high threshold for determining dominant tones and a preferably fractional low threshold for determining lack of substantial existence of tones. The goal of the function is to determine a list of frequency bins n∈0 . . . N−1 containing dominant tones applicable for single tone per tone block correction of a block. Line 14 initializes this list to an empty list of applicable tones and line 15 begins the loop over all possible tone frequency bins in the DFT. Lines 16 and 17 gather the positive tone frequencies and the dominant tone locations and conjugation in the block corresponding to the bin being examined and corresponding to $\mathcal{R}_{[n]}$ and $\mathcal{T}_{[n]}$ described previously and provided by (63), (64) and/or (66). On line 18 the determination of suitability of the tone is initialized to True in anticipation of success.

On line 19, each i∈0 . . . I−1 is looped over representing the tones present in the tone block corresponding to the bin. On line 20 a check is made whether a dominant tone corresponding to the current bin should be present in the block location. A value of one or negative one is indicative of the dominant tone expectation. If it is non zero, the frequency-domain vector is checked for existence of a dominant tone by comparing to the absolute high threshold in line 21. If the tone is not above the threshold, then the current tone bin is deemed unsuitable on line 22 and the loop exits on line 23. Otherwise, a dominant tone has been found and a multiplier for threshold for determining substantially nonexistent tones is determined from the size of the dominant tone on line 24 and the loop continues.

At line 25, the previous loop has exited and one of two things is true. Either the current bin being analyzed is deemed unsuitable and the variable IsOne is false, or a dominant tone has been found in the proper locations. If a dominant tone has been found processing continues to line 26 where the absolute threshold for the determination of substantially nonexistent tones is calculated. On line 27 the loop repeats over each i∈0 . . . I−1 tones. On line 28 a check is again made whether a dominant tone corresponding to the current bin should be present in the block location. If not, the program continues to line 29 where the bin in the DFT is checked against an absolute threshold for a substantially nonexistent tone. If the tone is too large indicating a tone presence at a non-dominant tone location, then the current bin is deemed unsuitable on line 30 and the loop breaks on line 31. On line 32, a check is made whether all of the conditions were met for suitability, and if the bin is suitable, the bin number of the current bin being analyzed is added to the list. At line 33, a complete list of all bins exist that are suitable for determination of interleave correction based on our preferred method of using single dominant tones per tone block and this list is returned.

On line 34, one sees the function definition NewMeasurement which is the main function utilized to supply new measurements to the system. New measurements are supplied in the variable xhat and the optional variable x corresponding to a $\hat{X}$ containing observations and X containing the correct frequency-domain signals, respectively. Preferably X is not known (i.e. the calibration is a blind calibration) and if so, an assumption is made that the variable xhat contains tones that are deemed to be correct on line 35, with the understanding that only dominant tones found in $\hat{X}$ are actually substantially correct tones.

On line 36 the list of tone bins in X that are deemed acceptable for calibration according to threshold criteria are gathered and on line 37, looping begins over all of the acceptable tone bins.

Lines 38-41 gather all of the information required for the current tone bin corresponding to $\mathcal{R}_{[n]}$, $\mathcal{C}_{[n]}$, $\mathcal{T}_{[n]}$ and $\mathcal{B}_{[n]}$ previously described and provided by (65) and/or (66).

Line 42 initializes xprimev, which corresponds to $\overset{b}{X}'_{[b]}$ to empty and line 43 initializes xhatv, which corresponds to $\hat{X}_{[b]}$, to an I×1 element vector.

On line 44, the location of the dominant tones in the block is initialized to an empty list indicating none has been found yet. On line 45 the program loops over each i∈0 . . . I−1 and on line 46, if the current tone bin is found at location i in the block, the index of this tone found is retained. On line 47, a check is made to see if the dominant tone is present in this location in the block and if it is, it is obtained from the DFT and appended to xprimev in possibly conjugated form on lines 47 and 48 according to the previous discussion. On line 49, $(\hat{X}_{[b]})_{[i]}$ is filled in as presented in (68). On lines 50 and 51, the determined matrices $\overset{b}{X}'_{[b]}$ and $\hat{X}_{[b]}$ are accumulated into member variables m_Xhat and m_Xprime, representing $\overset{b}{X}'_{[b]}$ and $\overset{b}{\hat{X}}_{[b]}$ as previously discussed.

As mentioned in the previous discussion, usually $\overset{b}{X}'_{[b]}$ contains a single element, but sometimes it contains more. In this case, it is possible for $\overset{b}{X}'_{[b]}$ to be a skinny matrix until sufficient measurements have been accumulated. Therefore, on line 52 a test is made for this situation and if the matrix is skinny, the function exits after simply accumulating the measurement. On line 53, the variable Hbprime, which is representative of $\overset{b\,'}{\mathbb{H}}_{[b]}$ is computed according to (69). Since $\overset{b}{\mathbb{H}}_{[b]}$ represents at least one column of $\overset{b}{\mathbb{H}}_{[b]}$, these columns are installed into member m_Hb[b] in lines 54-56. On lines 57-59, optional steps are taken of converting $\overset{b\,'}{\mathbb{H}}_{[b]}$ into a row of H. The loop continues for all n contained in the list WhichOnes.

It is important to note that the program listing provided in FIG. 6 is one of many possible and should not be considered limiting as many other options were discussed in the previous text. For example, it is possible to average the results and to clear m_Xhat and m_Xprime after each calculated result of a column and to compute rows of H at a slower rate, for example, after many measurements are provided to the algorithm or even to calculate H from $\overset{b}{H}$ outside the NewMeasurement function. Other options have been discussed even more comprehensive than this list. Furthermore, the program listing provided does not make certain checks that would be recommended, most notably for the singularity of m_Xprime [n] or the believability of m_H.

FIG. 7 and FIG. 8 provide for the pre-calculations of values utilized in the listing in FIG. 6.

FIG. 7 depicts the class InterleaveInfo declared on line 1. Line 2 contains the constructor which is the only function present for the class. In this way, the intent is to construct an instance of the InterleaveInfo class and then extract all of the initialized member variables. On line 3, the member m_I corresponding to the argument for I provided on line 2. On line 4, N is defined as K/2, thus indicating that this function is designed for use with even K. A DSP engineer skilled in the art would know how to make the obvious changes to incorporate odd values of K if necessary.

Lines 5 through 11 compute temporary variables p according to (60), f according to (62), r according to (63), and c according to (64). Line 12 establishes the number of blocks as K/(2·I)+1 thus indicating that this function is designed for K a multiple of 2·I although this should not be interpreted as limiting and obvious changes can be made to accommodate other situations. Lines 13-16 compute the member variable m_B which corresponds to $\mathcal{B}$ according to (65). Line 17 assigns m_R which corresponds to $\mathcal{R}$ according to previous discussion. Line 18 assigns m_C which corresponds to $C$ according to previous discussion. Lines 19 through 21 assign m_T which corresponds to $\mathcal{T}$ according to (66). Line 22 retains the value of N previously calculated on line 4.

In FIG. 8, lines 1 and 2 provide for the importation of complex math and math functions which come from the Numpy package, a common math package utilized with Python for which information can be found at www.Numpy.org. The well known complex exponential and the definition of 7 are all that are used from these packages. Line 3 imports a Matrix class whose operations and functions are deemed obvious to one skilled in the art. Line 4 is empty. One sees the function LiCalc declaration on line 5, which calculates information utilized to convert $\overset{b}{H}$ to H. Lines 6 through 12 calculate, for i∈0 . . . I−1, the I element list of each $(\overset{b}{L}_{[i]})^{-1}$ according to (57). Line 13 returns this list of pre-calculated matrices.

The prior discussion focused on the determination of block impairment transfer matrices and the optional determination of a digitizer frequency response matrix in m_Hb and m_H respectively, with the understanding that this information is useful in performing interleave correction. In FIG. 9 a preferred method is shown of utilizing the correction data in the correction of waveform data corrupted by interleave error. In FIG. 9, line 1 imports a Matrix class whose operations and functions are deemed obvious to one skilled in the art. Line 2 is empty. Line 3 declares the class Interleave Corrector which is the class used for performing interleave correction. Line 4 declares the _init_ function which is the class constructor and which takes as an argument Hb. This argument Hb is a set of block impairment transfer matrices and corresponds to the data produced in FIG. 6 as the member variable m_Hb in the class OnTheFlyInterleaveCorrection. Lines 5 and 6 provide for the determination of the number of interleaved digitizers I and the number of points K contained in a time-domain acquisition segment that would be used to produce a frequency-domain acquisition segment to be provided later. On line 7 one sees the conversion of the block impairment transfer matrices to block correctors through the matrix inverse. Line 8 initializes the number of interleaved digitizers. Lines 9-19 provide for the initialization of variables p according to (60), f according to (62), r according to (63), and c according to (64) and the number of blocks as K/(2·I)+1 thus indicating that this function is designed for K a multiple of 2·I although this should not be interpreted as limiting and obvious changes can be made to accommodate other situations.

Once initialized, the Interleave Corrector class is positioned to correct any frequency-domain acquisition segments provided through calls to CorrectBuffer declared on line 20. On line 21 the frequency-domain ideal waveform segment result is initialized in X to the same size as the frequency-domain acquisition segment provided in Xhat. Intermediate storage for each of the frequency-domain ideal block segments is provided on line 22 as an I×1 element column vector in Xhatb. Then, starting on line 23, each block is looped over and lines 24-27 fill in Xhatb, which is a frequency-domain block acquisition segment for the current block. On line 28 the frequency-domain ideal block segment is calculated by pre-multiplying the frequency-domain block acquisition segment by one of the block correctors for the current block. Then, lines 29-32 place the values in the frequency-domain ideal block segment into the correct location in the frequency-domain ideal waveform segment. When line 33 is reached, one has essentially half of a frequency-domain ideal waveform segment corresponding positive frequencies. Lines 33-36 create the essentially other half of the frequency-domain ideal waveform segment corresponding to the negative frequencies. The frequency-domain ideal waveform segment is returned on line 37 and could be converted to a time-domain ideal waveform segment through the application of the inverse discrete Fourier transform (IDFT).

The method provided in FIG. 9 in the InterleaveCorrector class is substantially similar to that provided in U.S. Pat. No. 6,819,279 filed Mar. 5, 2003 to Pupalaikis and preferably utilizes a set of block impairment transfer matrices for correction with the recognition that there are many other ways of employing the actual correction with similar results.

It will thus be seen that the program listings in FIG. 7 and FIG. 8 provide for the pre-calculations and the program listing in FIG. 6 provide for a very efficient method for providing for interleave correction.

Figure 1:
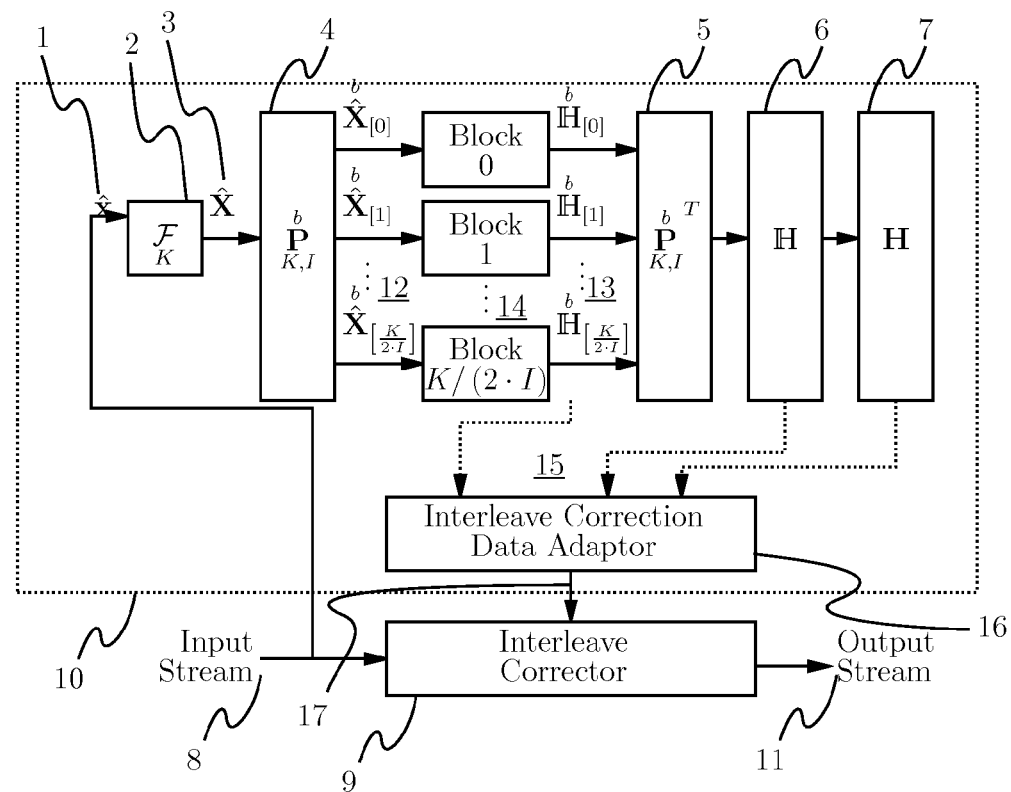
FIG. 1 is a block diagram of an on-the-fly interleave error correction apparatus according to the present invention.

In FIG. 1, a proposed implementation is shown of an apparatus for correcting for interleave error. In FIG. 1, there is a time-domain input stream [8] containing a stream of input data acquired by a system of interleaved digitizers and impaired by interleave error. At predetermined or random intervals, waveform data is picked off from the input stream and fed to the interleave correction data generator [10]. The waveform data is represented by a time-domain acquisition segment [1]. This time-domain acquisition segment [1] preferably contains a buffer of K elements where pre-calculations have been made based on K and the number of interleaved digitizers I, but note that the term time-domain acquisition segment can be used to define any buffer containing acquired samples from a system. This time-domain acquisition segment [1] is converted to a frequency-domain acquisition segment [3] through the use of a time-to-frequency-domain conversion element [2] that could be implemented in a variety of ways, usually as the FFT or DFT. Generally speaking, a frequency-domain acquisition segment [3] refers to any frequency-domain equivalent structure corresponding to a time-domain acquisition segment. This frequency-domain acquisition segment [3] is then converted to possibly many frequency-domain block acquisition segments [12] through the use of a frequency-domain acquisition segment blocker [4] whose purpose is to arrange the unblocked frequency-domain acquisition segment [3] into frequency-domain block acquisition segments [12] where each block contains groups of related tones due to interleave error according to (63). Thus, a frequency-domain block acquisition segment [35] refers to any related group of tones from frequency-domain block acquisition segments [12] where the grouping is due to the interleave architecture. Preferably, each of the frequency-domain block acquisition segments [12] are processed by one of the block transfer matrix calculators [14], each producing one of the block impairment transfer matrices [13]. The block impairment transfer matrices [13] can be converted to block correction transfer matrices through the matrix inverse to be used by interleave corrector [9]. Optionally, the block impairment transfer matrices [13] can be converted into an impairment transfer matrix [6] through the use of a block transfer matrix unblocker [5] whose purpose is to convert $\overset{b}{H}$ back to $\mathbb{H}$ according to the relationship in (22). This impairment transfer matrix [6] can be utilized to correct for interleave in manners not utilizing frequency-domain block acquisition segments [12], but instead directly utilizing unblocked buffers like frequency-domain acquisition segment [3]. Furthermore, impairment transfer matrix [6] can be used for the determination of time-domain polyphase filters for interleave correction. Optionally, impairment transfer matrix [6] can be converted into a digitizer frequency response matrix [7] or block impairment transfer matrices [13] can be converted into a digitizer frequency response matrix [7] using the relationships in (70) or (45). This optional step produces a digitizer frequency response matrix [7] which can also be utilized by some embodiments of interleave corrector [9] and can also be used to perform sanity checks on the correction data as digitizer frequency response matrix [7] can be considered the frequency response of each digitizer and is the easiest form in which to make judgments on correctness. Also, in some embodiments, the time-domain input stream [8] can contain already corrected data for interleave error according to a static factory calibration and the interleave corrector [9] can be utilized to refine the correction in which case digitizer frequency response matrix [7] could be expected to contain a matrix of numbers arbitrarily close to unity and too far of a deviation from unity can be utilized as a detection mechanism for the failure of the system to properly determine the correction. Regardless of whether the block impairment transfer matrices [13], impairment transfer matrix [6], or digitizer frequency response matrix [7] are calculated, any of these can be provided as one of the interleave correction data adapter inputs [15] to the interleave correction data adaptor [16] which outputs data adapted to the form required for the interleave corrector [9] through the interleave correction data input [17], thus enabling the system to convert time-domain input stream [8] to time-domain output stream [11] through the use of interleave corrector [9] and provide substantial correction for interleave error.

Figure 3:
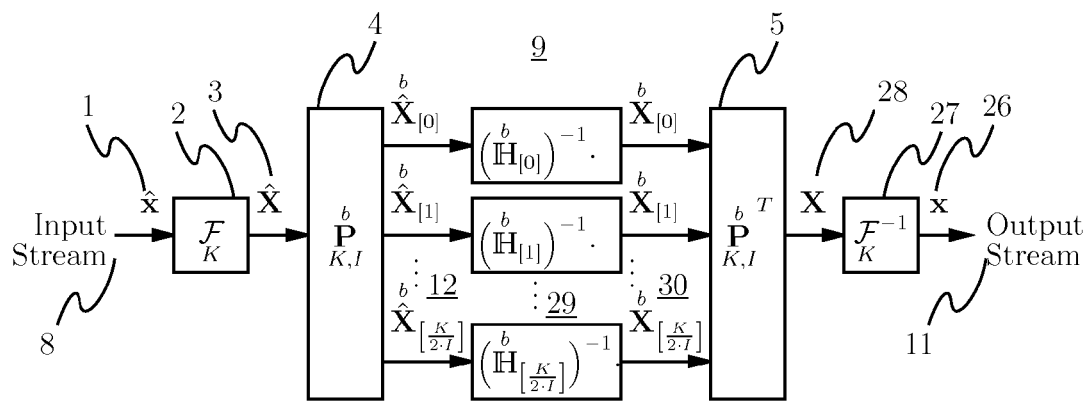
FIG. 3 is a block diagram of an interleave corrector according to the prior art.

In the prior discussion, means were provided for producing correction data usable for correcting for interleave error in the form of block impairment transfer matrices, an impairment transfer matrix, and a digitizer frequency response matrix with the understanding that these can be converted to time-domain digitizer response matrices, as well. Since these are all impairments, the correction is preferably performed utilizing inverses of block impairment transfer matrices, impairment transfer matrix, and/or the corresponding digitizer frequency and time-domain responses. In FIG. 3, to provide some context, an embodiment is shown of an interleave corrector [9] in a preferred correction arrangement utilizing correction data derived from the block impairment transfer matrices. Here the inverses of the block impairment transfer matrices in the form of block correctors [29] are shown. This is a substantially similar form to the matrices provided in U.S. Pat. No. 6,819,279 filed Mar. 5, 2003 to Pupalaikis. Here, there is a time-domain input stream [8] presumably consisting of time-domain waveform data corrupted by interleave error. From this time-domain input stream [8], buffers of data are taken each in the form of a time-domain acquisition segment [1]. Each time-domain acquisition segment [1] is applied to a time-to-frequency-domain conversion element [2] which produces a frequency-domain acquisition segment [3]. Each frequency-domain acquisition segment [3] is applied to a frequency-domain acquisition segment blocker [4] which arranges the frequency-domain acquisition segment [3] into frequency-domain block acquisition segments [12]. Each of the frequency-domain block acquisition segments [12] is pre-multiplied by one of the block correctors [29] forming a set of frequency-domain ideal block segments [30] which, when applied to a block transfer matrix unblocker [5], produces a frequency-domain ideal waveform segment [28]. The frequency-domain ideal waveform segment [28] is preferably applied to an frequency-to-time-domain conversion element [27] to produce a time-domain ideal waveform segment [26], which, when startup and end samples in the time-domain ideal waveform segment [26] are dealt with, and these are combined with other time-domain ideal waveform segments calculated from other locations in the data stream to produce a time-domain output stream [11] consisting of substantially corrected waveform data corrected for interleave error. As mentioned previously, there are many similar such implementations of an interleave corrector [9] utilizing many different forms of the interleave correction data.

Figure 4:
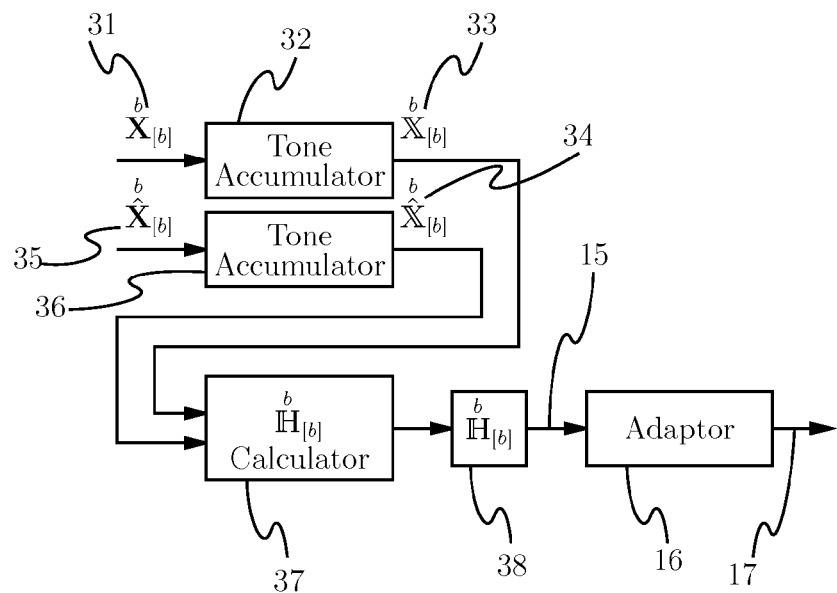
FIG. 4 is a block diagram of an apparatus for producing interleave correction data input to an interleave corrector for a tone group with known tone input according to the present invention.
Figure 5:
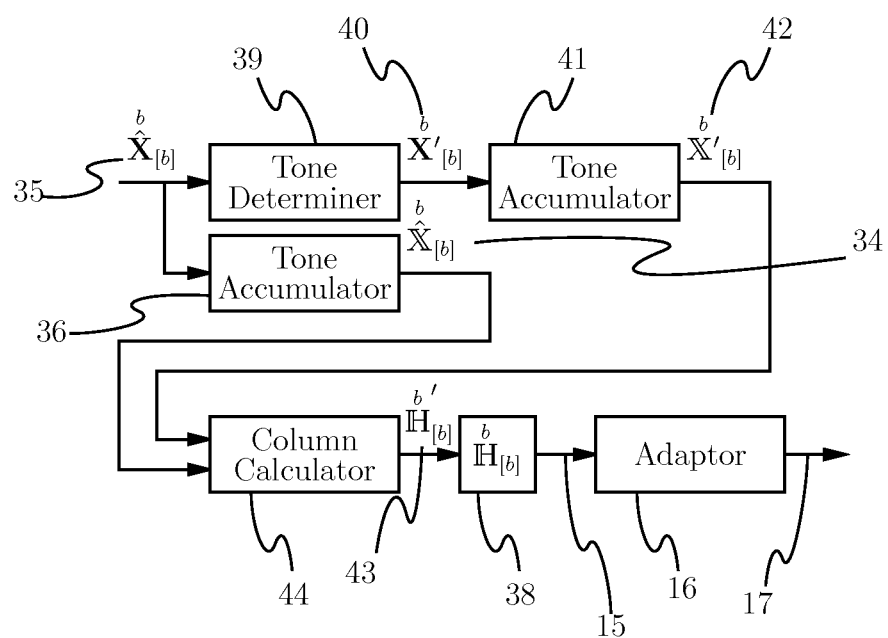
FIG. 5 is a block diagram of an apparatus for producing interleave correction data input to an interleave corrector for a tone group with unknown input according to the present invention.

While the prior discussion provided many options for converting sets of instances of a time-domain acquisition segment [1] into corrections suitable as interleave correction data input [17] to interleave corrector [9], FIG. 4 and FIG. 5 provide possible embodiments for the block transfer matrix calculators [14]; the first with a known applied signal and the second with an unknown applied signal.

Shown in FIG. 4 is a possible embodiment of one of the block transfer matrix calculators [14]. It has two inputs: frequency-domain ideal block segment [31] and frequency-domain block acquisition segment [35] where frequency-domain block acquisition segment [35] is preferably one of the frequency-domain block acquisition segments [12]. Here, the frequency-domain ideal block segment [31] is preferably the known correct version of frequency-domain block acquisition segments [12] meaning that it represents what frequency-domain block acquisition segments [12] would be converted to through interleave correction. The frequency-domain ideal block segment [31] is accumulated by a frequency-domain known block segment accumulator [32] to produce an updated accumulated frequency-domain known block segment [33] and frequency-domain block acquisition segment [35] is accumulated by a frequency-domain block acquisition segment accumulator [36] to produce an updated accumulated frequency-domain block acquisition segment [34]. The accumulated frequency-domain known block segment [33] and the accumulated frequency-domain block acquisition segment [34] are passed to a block impairment transfer matrix calculator [37], which converts the inputs into an updated value held in a block impairment transfer matrix repository [38] which contains a matrix that is preferably one of the block impairment transfer matrices [13]. This conversion could utilize (35) or (36).

In FIG. 5 there is another possible embodiment of one of the block transfer matrix calculators [14]. It has one input frequency-domain block acquisition segment [35] where frequency-domain block acquisition segment [35] is preferably one of the frequency-domain block acquisition segments [12]. In this embodiment, frequency-domain block acquisition segment [35] is accumulated by a frequency-domain block acquisition segment accumulator [36] to produce an updated accumulated frequency-domain block acquisition segment [34] and applied to a block dominant tone determiner [39] which examines the frequency-domain block acquisition segment [35] for suitability for correction and potentially producing a block dominant tone segment [40] which, based on the previous discussion, could be representative of a single dominant tone in a given tone block. The block dominant tone segment [40] is shown here as being accumulated by a block dominant tone accumulator [41] to produce an accumulated block dominant tone segment [42]. Both the accumulated frequency-domain block acquisition segment [34] and accumulated block dominant tone segment [42] are supplied as inputs to a block impairment transfer column vector calculator [44] which determines a block impairment transfer column vector [43]. This determination could utilize (69). This block impairment transfer column vector [43] is then provided as an update to one column of the matrix in the value held in a block impairment transfer matrix repository [38] which contains a matrix that is preferably one of the block impairment transfer matrices [13].

It will thus be seen that an efficient and useful apparatus for interleave correction has been demonstrated.

Note that the inventors have anticipated various other features of the interleave correction. One is the ability to use windowing to alleviate the general requirement for bin centering of any tones entering the system. For example, a window, which is well known to those skilled in the art of DSP could be utilized. In windowed cases, one might prefer to acquire tones in a vector that has finer frequency resolution than $F_s/K$ where $F_s$ is the overall system sample rate, as the previous discussion implies. This finer frequency resolution would preferably be based on the spreading effect of the window. In this case, tones could be chosen from bin locations corresponding to frequencies of, for $n\epsilon 0 \ldots N$, $(n/N) \cdot F_s/2$, which could improve spectral concentration. Another consideration is the seeming dependence on even K, and $K/(2 \cdot I)$ being integer multiples. Examples shown in this specification rely on this, but the inventors assert that these reliances are only choices made to show concrete implementations and not limiting in any sense.

It will thus be seen that the objects set forth above, among those made apparent from the preceding description, are efficiently attained and, because certain changes may be made in carrying out the above method and in the construction(s) set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A method for generating correction data associated with an interleave corrector employed by a system for converting a time-domain input stream, corresponding to samples acquired from an interleaved system of digitizers having impairment due to interleave mismatch, to a time-domain output stream comprising the steps of:
    determining at least one time-domain acquisition segment including at least data from the time-domain input stream;
    determining at least one frequency-domain acquisition segment in accordance with the at least one time-domain acquisition segment;
    determining at least one frequency-domain block acquisition segment in accordance with the frequency-domain acquisition segment, whereby the frequency-domain block acquisition segment comprises a block of tone values;
    determining the suitability of the frequency-domain block acquisition segment for use in the generation of adjusted correction data based on comparison of dominant and not dominant tone bins to threshold criteria;
    determining a block dominant tone segment from the frequency-domain block acquisition segment; and
    determining a block impairment transfer column vector in accordance with the block dominant tone segment and the frequency-domain block acquisition segment,
    whereby the block impairment transfer column vector forms a column of a matrix in a block impairment transfer matrix repository where the block impairment transfer column vector corresponds to a row of a digitizer frequency response matrix transformable to correction data usable by the interleave corrector, and wherein the row corresponds to a relative frequency response of each digitizer to a frequency.

2. An apparatus for converting a time-domain input stream corresponding to samples acquired from an interleaved system of digitizers having impairment due to interleave mismatch to a time-domain output stream comprising:
    an interleave corrector comprising one or more interleave correction data inputs for receiving correction data; and
    an interleave correction data generator, the interleave correction data generator further comprising:
    a time-to-frequency-domain conversion element for converting one or more time-domain acquisition segments of a time-domain input stream to one or more corresponding frequency-domain acquisition segments;
    a frequency-domain acquisition segment blocker for producing one or more frequency-domain block acquisition segments from the one or more frequency-domain acquisition segments, wherein each of the one or more frequency-domain block acquisition segments comprises a block of tone values at one or more frequencies;
    one or more block transfer matrix calculators for producing one or more block impairment transfer matrices corresponding to the one or more frequencies of the block of tone values;
    an interleave correction data adaptor for adapting the correction data; and
    one or more outputs for outputting the adapted correction data to the interleave correction data input.

3. The apparatus of claim 2 wherein the interleave correction data adaptor adapts the correction data in accordance with the one or more block impairment transfer matrices and the interleave corrector.

4. The apparatus of claim 2 wherein the interleave correction data generator further comprises a block transfer matrix unblocker for transforming the one or more block impairment transfer matrices into one or more impairment transfer matrix, wherein the interleave correction data adaptor adapts correction data in accordance with the one or more impairment transfer matrix and the interleave corrector.

5. The apparatus of claim 2 wherein the interleave correction data generator further comprises means for transforming the one or more block impairment transfer matrices into a digitizer frequency response matrix.

6. The apparatus of claim 5 whereby the interleave correction data adaptor further comprises means for checking the digitizer frequency response matrix for acceptability in accordance with an acceptance criteria.

7. The apparatus of claim 6 whereby the acceptance criteria involves a maximum deviation from unity of any elemental value.

8. The apparatus of claim 2 whereby at least one of the one or more block transfer matrix calculators further comprises:
    means for inputting a frequency-domain block acquisition segment from the one or more frequency-domain block acquisition segments;
    means for inputting a frequency-domain ideal block segment;
    a frequency-domain block acquisition segment accumulator for accumulating one or more frequency-domain block acquisition segments and providing one or more accumulated frequency-domain block acquisition segments;
    a frequency-domain known block segment accumulator for accumulating at least one frequency-domain ideal block segment and providing an accumulated frequency-domain known block segment; and
    a block impairment transfer matrix calculator for calculating one of the one or more block impairment transfer matrices in accordance with the one or more accumulated frequency-domain block acquisition segments and one or more accumulated frequency-domain known block segments.

9. The apparatus of claim 2 whereby one of the one or more block transfer matrix calculators further comprise:

means for inputting a frequency-domain block acquisition segment from the one or more frequency-domain block acquisition segments;

a block dominant tone determiner for determining suitability of the frequency-domain block acquisition segment, and for producing a block dominant tone segment;

a frequency-domain block acquisition segment accumulator for accumulating at least one frequency-domain block acquisition segment and providing an accumulated frequency-domain block acquisition segment;

a block dominant tone accumulator for accumulating at least one block dominant tone segment and providing an accumulated block dominant tone segment; and a block impairment transfer column vector calculator for calculating a block impairment transfer column vector in accordance with the accumulated frequency-domain block acquisition segment and accumulated block dominant tone segment;

whereby the block impairment transfer column vector forms a column of a matrix in a block impairment transfer matrix repository and said block impairment transfer column vector corresponds to a row of a digitizer frequency response matrix transformable to correction data usable by the interleave corrector where said row corresponds to the relative frequency response of each digitizer to a frequency.

10. A method for converting a time-domain input stream corresponding to samples acquired from an interleaved system of digitizers having impairment due to interleave mismatch to a time-domain output stream comprising:

receiving correction data by an interleave corrector comprising one or more interleave correction data inputs; and generating interleave correction data by an interleave correction data generator, the step of generating the interleave correction data further comprising:

converting one or more time-domain acquisition segments of a time-domain input stream to one or more corresponding frequency-domain acquisition segments by a time-to-frequency-domain conversion element;

for producing one or more frequency-domain block acquisition segments from the one or more frequency-domain acquisition segments by a frequency-domain acquisition segment blocker, wherein each of the one or more frequency-domain block acquisition segments comprises a block of tone values at one or more frequencies;

producing one or more block impairment transfer matrices corresponding to the one or more frequencies of the block of tone values by one or more block transfer matrix calculators;

adapting the correction data by an interleave correction data adaptor; and outputting the adapted correction data to the interleave correction data input.

11. The method of claim 10 further comprising adapting the correction data in accordance with the one or more block impairment transfer matrices and the interleave corrector.

12. The method of claim 11 further comprising:

transforming the one or more block impairment transfer matrices into one or more impairment transfer matrix by a block transfer matrix unblocker; and adapting correction data in accordance with the one or more impairment transfer matrix and the interleave corrector by the interleave correction data adaptor.

13. The method of claim 11, further comprising transforming the one or more block impairment transfer matrices into a digitizer frequency response matrix by the interleave correction data generator.

14. The method of claim 13, further comprising checking the digitizer frequency response matrix for acceptability in accordance with an acceptance criteria by the interleave correction data adaptor.

15. The method of claim 14 whereby the acceptance criteria involves a maximum deviation from unity of any elemental value.

16. The method of claim 11, wherein producing the one or more block impairment transfer matrices corresponding to the one or more frequencies of the block of tone values comprises:

inputting a frequency-domain block acquisition segment from the one or more frequency-domain block acquisition segments;

inputting a frequency-domain ideal block segment;

for accumulating one or more frequency-domain block acquisition segments and providing one or more accumulated frequency-domain block acquisition segments by a frequency-domain block acquisition segment accumulator;

accumulating at least one frequency-domain ideal block segment and providing an accumulated frequency-domain known block segment by a frequency-domain known block segment accumulator; and calculating one of the one or more block impairment transfer matrices in accordance with the one or more accumulated frequency-domain block acquisition segments and the one or more accumulated frequency-domain known block segments by a block impairment transfer matrix calculator.

17. The method of claim 11, wherein producing the one or more block impairment transfer matrices corresponding to the one or more frequencies of the block of tone values further comprises:

inputting a frequency-domain block acquisition segment from the one or more frequency-domain block acquisition segments;

determining suitability of the frequency-domain block acquisition segment, and for producing a block dominant tone segment by a block dominant tone determiner;

accumulating at least one frequency-domain block acquisition segment and providing an accumulated frequency-domain block acquisition segment by a frequency-domain block acquisition segment accumulator;

accumulating at least one block dominant tone segment and providing an accumulated block dominant tone segment by a block dominant tone accumulator; and calculating a block impairment transfer column vector in accordance with the accumulated frequency-domain block acquisition segment and accumulated block dominant tone segment by a block impairment transfer column vector calculator, whereby the block impairment transfer column vector forms a column of a matrix in a block impairment transfer matrix repository and said block impairment transfer column vector corresponds to a row of a digitizer frequency response matrix transformable to correction data usable by the interleave corrector where said row corresponds to the relative frequency response of each digitizer at a frequency.

* * * * *